US008648339B2

United States Patent
Koyama et al.

(10) Patent No.: US 8,648,339 B2
(45) Date of Patent: Feb. 11, 2014

(54) SEMICONDUCTOR DEVICE INCLUDING FIRST SEMICONDUCTOR CHIP INCLUDING FIRST PADS CONNECTED TO FIRST TERMINALS, AND SECOND SEMICONDUCTOR CHIP INCLUDING SECOND PADS CONNECTED TO SECOND TERMINALS

(75) Inventors: Takahiro Koyama, Tokyo (JP); Sadayuki Okuma, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 482 days.

(21) Appl. No.: 12/926,293

(22) Filed: Nov. 8, 2010

(65) Prior Publication Data
US 2011/0121294 A1 May 26, 2011

(30) Foreign Application Priority Data
Nov. 25, 2009 (JP) ................................. 2009-266922

(51) Int. Cl.
*H01L 23/58* (2006.01)
(52) U.S. Cl.
USPC .............. 257/48; 257/E21.521; 257/E21.524; 257/E23.179
(58) Field of Classification Search
USPC ............... 257/48, E23.01, E21.521, E21.524, 257/E23.179
See application file for complete search history.

(56) References Cited

U.S. PATENT DOCUMENTS

| 6,762,486 B2 * | 7/2004 | Inoue et al. ................... 257/686 |
| 6,897,554 B2 * | 5/2005 | Inoue et al. ................... 257/686 |
| 6,914,259 B2 * | 7/2005 | Sakiyama et al. .............. 257/48 |
| 2002/0047192 A1 * | 4/2002 | Inoue et al. ................... 257/686 |
| 2007/0114529 A1 * | 5/2007 | Whetsel et al. ................. 257/48 |
| 2008/0185586 A1 * | 8/2008 | Lin ................................ 257/48 |
| 2009/0114914 A1 * | 5/2009 | Lin ................................ 257/48 |
| 2011/0121848 A1 * | 5/2011 | Komoto et al. .......... 324/754.18 |
| 2011/0193086 A1 * | 8/2011 | Lee et al. ........................ 257/48 |

FOREIGN PATENT DOCUMENTS

JP         2006-73153         3/2006

* cited by examiner

*Primary Examiner* — Bilkis Jahan
(74) *Attorney, Agent, or Firm* — McGinn IP Law Group, PLLC

(57) ABSTRACT

A semiconductor device includes a plurality of first data input/output terminals, a plurality of second data input/output terminals, a first semiconductor chip, and a second semiconductor chip. The first semiconductor chip includes a plurality of first data input/output pads connected with the first data input/output terminals, a first test circuit, and a first memory portion. The first test circuit generates a first test result in response to a data output from the first memory portion at a test operation. The second semiconductor chip includes a plurality of second data input/output pads connected with the second data input/output terminals, a second and a third test circuits, and a second memory portion. The second test circuit generates a second test result in response to a data output from the second memory portion, and the third test circuit generates a third test result in response to the second test result and the first test result input from the first test circuit of the first semiconductor chip and outputs the third test result from a specified second data input/output terminal.

16 Claims, 18 Drawing Sheets

US 8,648,339 B2

SEMICONDUCTOR DEVICE INCLUDING FIRST SEMICONDUCTOR CHIP INCLUDING FIRST PADS CONNECTED TO FIRST TERMINALS, AND SECOND SEMICONDUCTOR CHIP INCLUDING SECOND PADS CONNECTED TO SECOND TERMINALS

REFERENCE TO RELATED APPLICATION

This application is based upon and claims the benefit of the priority of Japanese patent application No. JP2009-266922 filed on Nov. 25, 2009, the disclosure of which is incorporated herein in its entirety by reference thereto. The present invention relates to a semiconductor device. Particularly, the present invention relates to a semiconductor device including a plurality of semiconductor chips and test circuits thereof.

TECHNICAL FIELD

Background

As for a semiconductor device such as a memory or the like, the more a semiconductor device is large-integrated and high-functioned, the more a test apparatus for testing the functions of the semiconductor device becomes expensive and the testing time becomes longer. An example of the test apparatus is a memory test system. To avoid the problem, a plurality of semiconductor devices (which are to be tested) are tested in parallel with one test apparatus.

FIG. 1 shows a schematic structure of a test system for performing parallel tests for a plurality of semiconductor devices. Devices to be tested (semiconductor devices) 900 shown in FIG. 1 include one semiconductor chip in one package. A test board 101 in FIG. 1 is provided with a plurality of sockets 102 and each of the sockets 102 is provided with a plurality of pins for connecting with a plurality of external terminals of the semiconductor devices. Each of the pins is connected with a measurement pin on a test apparatus 103 via a line on the test board 101 and a line 104 connecting between the test board 101 and the test apparatus 103. Because the number of the measurement pins on the test apparatus 103 is limited, the number of devices 900 that can be tested at one test procedure is limited to the number of the measurement pins on the test apparatus 103. Therefore, a test method is frequently utilized to increase the number of the devices to be tested at one test procedure.

FIG. 2 is an example of a test method to increase the number of semiconductor devices to be tested at one test procedure. FIG. 2 illustrates a schematic diagram of line connection for a packaged semiconductor device 900 mounted on the socket 102 on the test board. In FIG. 2, external terminals for control signals that are disposed on the semiconductor device 900 and connected to control signal pads (command, address and clock) of a semiconductor chip 911 in the semiconductor device 900 are connected with corresponding control signal measurement pins (driver pins) of the test apparatus via control lines 104B. As to DQ terminals that are disposed on the semiconductor device 900 and connected to data signal pads (DQ pads) on the semiconductor chip 911 in the semiconductor device 900, one of the plurality of DQ terminals is connected to a corresponding measurement pin of the test apparatus and the other DQ terminals are not connected to the test apparatus and in open state. The semiconductor device 900 shown in FIG. 2, only one degenerated data of a plurality of data, which should be output from a plurality of DQ terminals during a normal operation, is output from one DQ terminal to the test apparatus during a test operation. More concretely, when at least one test result among a plurality of test results (each corresponding to each DQ terminal) is a fail, the test result of a fail is output from a specified DQ terminal and when all of the test results are good, a good test result indicating a pass in the test is output from the specified DQ terminal. The number of semiconductors to be tested at one test procedure can be thus increased by reducing the number of DQ terminals on semiconductor devices connected to a test apparatus at a test procedure by such a way and therefore an efficiency of the test procedure for semiconductor devices can be improved.

Recently, a semiconductor device in which a plurality of semiconductor chips are packaged (multi-chips package, MCP) is being developed. FIGS. 3A and 3B show an examples of such a semiconductor device, in which two semiconductor chips 912 are integrated into one semiconductor package. FIG. 3A is a sectional drawing and FIG. 3B is a perspective view of it, respectively.

Patent Document 1 discloses a conventional test method for a multi-chip packaged semiconductor device containing a plurality of memory chips. According to the disclosure of Patent Document 1, data signals (TA0, TB0, TA1, TB1 and the like) of the plurality of memory chips are connected in common, and on the other hand, separate terminals are provided for control signals (/CE1 to /CE4). The data signal terminals of the memory chips are connected in common to a test apparatus and the control signal terminals are connected separately to the test apparatus. The connection shown in Patent Document 1 enables a read/write test only for memory chips selected by the control signals (/CE1 to /CE4) among the plurality of memory chips. Patent Document 1 discloses that an area for memory chip can be reduced by providing an input/output degenerating circuit in only a specified memory chip among the plurality of memory chips and read-testing other memory chips using the input/output degenerating circuit of the specified memory chip.
[Patent Document 1]
JP Patent Kokai Publication No. JP-P2006-73153A

SUMMARY

The entire disclosure of Patent Document 1 is incorporated herein by reference thereto. The following analyses are given by the present invention.
Among multi-chips packaged semiconductors, there is a semiconductor device in which each of a plurality of control signal pads of a plurality of semiconductor chips is commonly connected with a corresponding external terminal of the semiconductor package and each of a plurality of data signal pads (data input/output pads) of a plurality of semiconductor chips is individually connected with each of corresponding external terminals of the semiconductor package. An arrangement of the external terminals of such a semiconductor device can be the same as, for example, an arrangement of a semiconductor package mounting a semiconductor chip that has the same number of control signal pads and twice the number of data signal pads, and therefore the semiconductor device can easily be replaced with such a semiconductor package.

However, a multi-chips packaged semiconductor device whose control signal pads are commonly connected and whose data signal pads are individually connected has a problem as follows at a testing procedure described above. The problem is that when testing a semiconductor device shown in FIGS. 3A and 3B using a test board (as shown in FIG. 2) in which only one data signal pad among a plurality of data signal pads of the semiconductor device is connected with a test apparatus, a test result of the other semiconductor chip cannot be output. That is, as shown in FIG. 4, although control lines 104B(1) of a chip 1 and control lines 104B(2) of a chip 2 are commonly connected with a test apparatus, a specified DQ line for data input/output among a plurality of DQ lines 104A(1) of the chip 1 is connected with the test apparatus and none of DQ lines 104A(2) of the chip 2 is connected with the test apparatus. Thus the chip 2 cannot be tested by the conventional method.

According to a first aspect of the present invention, there is provided a semiconductor device containing a plurality of first data input/output terminals, a plurality of second data input/output terminals, a first semiconductor chip, and a second semiconductor chip. The first semiconductor chip comprises a plurality of first data input/output pads connected respectively with the first data terminals, a first test circuit and a first memory portion. The first semiconductor chip outputs a first data of the first memory portion to the plurality of first terminals through the plurality of first pads during a normal operation, and the first test circuit generates a first test result in response to the first data during a test operation. The second semiconductor chip comprises a plurality of second pads connected respectively with the plurality of second terminals, a second test circuit, a third test circuit and a second memory portion. The second semiconductor chip outputs a plurality of second data of the second memory portion to the plurality of second data terminals through the plurality of second data input/output pads during the normal operation. The second test circuit generates a second test result in response to the second data, the third test circuit generates a third test result in response to the second test result and the first test result supplied from the first test circuit of the first semiconductor chip, and the third test result is output to one of second terminals through a corresponding one of second data pads during the test operation.

According to a second aspect of the present invention, there is provided a semiconductor device comprising: a plurality of semiconductor chips each comprising; a plurality of first pads and a second pad, a memory cell array, a first test circuit coupled to the memory cell array and generating a first test result signal in response to first test data of the memory cell array, a first input/output buffer coupled to the first test circuit and the second pad, the first input/output buffer supplying the first test result signal to the second pad when the each of the semiconductor chips is in a first test mode, the first input/output buffer generating a second test result signal therein in response to one or ones of third test result signals supplied from the second pad when the each of the semiconductor chips is in second test mode, and a second test circuit receiving the first test result signal and the second test result signal, performing a logic operation on logic levels of the first test result signal and the second test result signal to generate a fourth test result signal and supplying the fourth test result signal to first one of the first pads when the each of the semiconductor chips is in the second test mode. The second pad of one of the semiconductor chips is electrically coupled to the second pad of each of remaining one or ones of the semiconductor chips and the one of the semiconductor chip is in the second test mode and the remaining one or ones of the semiconductor chips are in the first test mode such that the first input/output buffer of the remaining one or ones of the semiconductor chips supplies the first test result signal to the second pad of the one of the semiconductor chips as one of the third test result signals.

According to a third aspect of the present invention, there is provided a semiconductor device containing two or more semiconductor chips each comprises a plurality of data input/output pads, a data memory portion structured so as to read/write data through the plurality of data input/output pads, a test result input/output pad, and a test circuit for controlling a first test mode that decides data read from the data memory portion and outputs the decision from the test result input/output pad and a second test mode that decides data read from the data memory portion, inputs test result(s) of (the) other semiconductor chip(s) from the test result input/output pad and outputs a synthesized test result of the test result of the chip itself and the result(s) of the other semiconductor chip(s) from a specified part of the plurality of data input/output pads, and a plurality of data input/output terminals each connected with different data input/output pads from the plurality of data input/output pads of the two or more semiconductor chips, in which the semiconductor device is structured such that the test result input/output pads of the two or more semiconductor chips are connected with each other and during a test operation one of the two or more semiconductor chips is set in the second test mode and the other semiconductor chip(s) are set in the first test mode, and that a test result of the two or more semiconductor chips executed in parallel can be output from the data input/output terminal connected with the specified part of the plurality of data input/output pads of the one semiconductor chip.

The meritorious effects of the present invention are summarized as follows. According to the present invention, a plurality of semiconductor chips can be tested in parallel even when data input/output pads of some of the semiconductor chips are not connected with a test apparatus because the plurality of semiconductor chips output their own test results to a specified semiconductor chip and the specified semiconductor chip synthesizes all of the test results and outputs the synthesized result.

PREFERRED MODES

According to an exemplary embodiment of the present invention, a semiconductor device comprises a first and a second semiconductor chips and each of the semiconductor device contains a test circuit (a first test circuit and a second test circuit, respectively) for generating a test result (a first test result and a second test result, respectively) based on data output from a memory portion (a first memory portion and a second memory portion, respectively), and the second semiconductor chip contains a third test circuit for generating a third test result based on the test result of the first semiconductor chip (the first test result) and the test result of the second semiconductor chip (the second test result), and the third test result is output to one of external terminals of the semiconductor device. Therefore the test result of the first semiconductor chip and the test result of the second semiconductor chip can be output from one external terminal of the semiconductor device and thus the test result of the two semiconductor chips in the semiconductor device can be output using a test board in which only one data input/output terminal among a plurality of data input/output terminals of the semiconductor device is connected with a test apparatus and as a result, a test board for a semiconductor device having the same arrangement of external terminals and having only one semiconductor chip whose number of input/output data pads are twice can be also applicable.

Some examples of the present invention will be explained in detail with reference to the drawings.

Example 1

Figure 9:
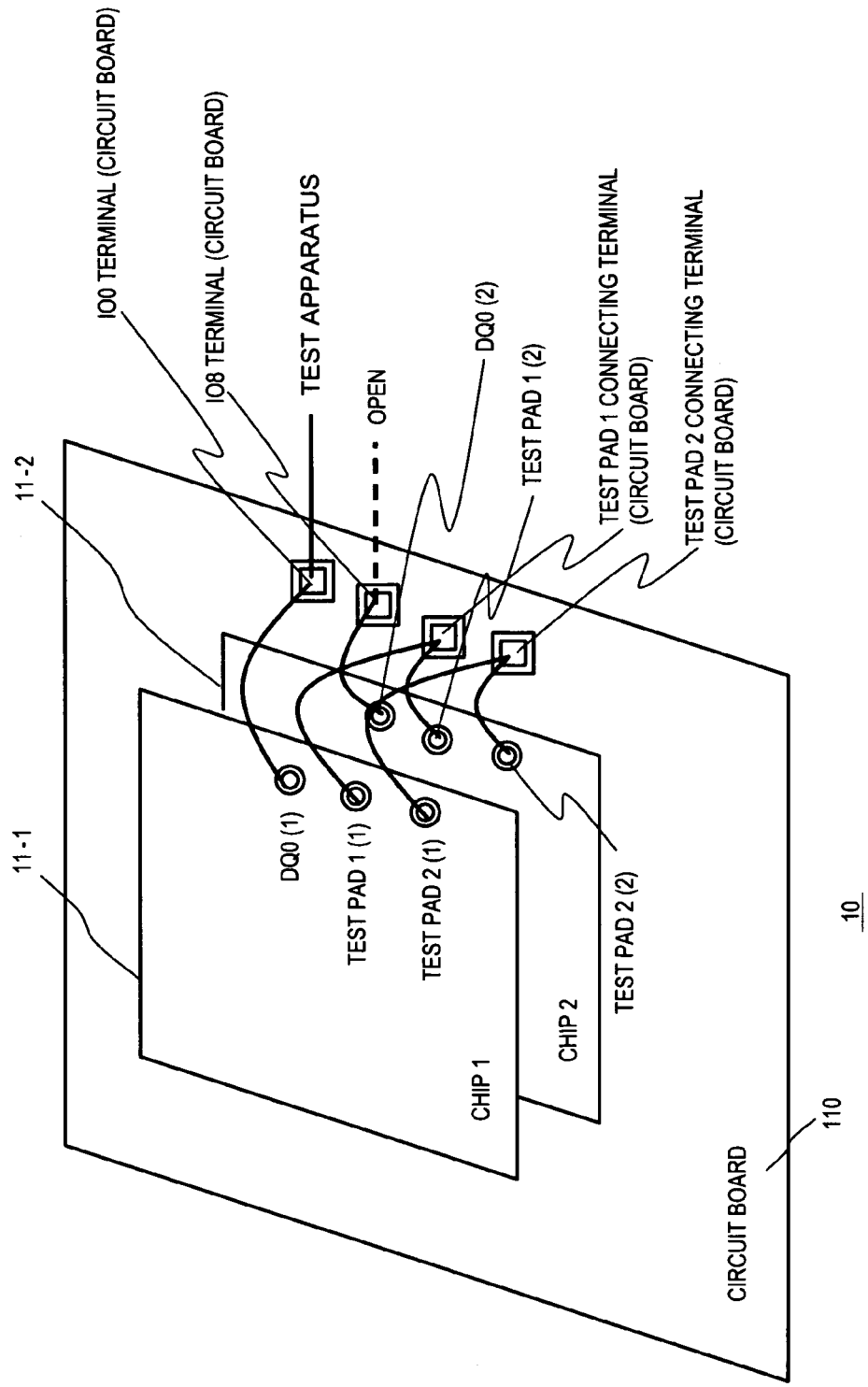
FIG. 9 is a schematic drawing of line connections of the semiconductor device according to an example 1.

FIG. 9 is a schematic drawing of line connections of a semiconductor device 10 according to an example 1. In FIG. 9, two semiconductor chips 11-1 and 11-2 are provided on a circuit board 110 of the semiconductor device 10. External connection terminals (not shown) for control signals provided on the semiconductor device 10 are commonly connected with control signal pads (command, address and clock) of the semiconductor chips 11-1 and 11-2 and each of the data input/output terminals (only IO0 terminal and IO8 terminal are shown in FIG. 9) is connected with one of the data input/output pads of the two semiconductor chips. In FIG. 9, the IO0 terminal is connected with a data input/output pad DQ0 (1) of the semiconductor chip 11-1 and not with the semiconductor chip 11-2. On the other hand, the IO8 terminal is connected with a data input/output pad DQ0(2) of the semiconductor chip 11-2 and not with the semiconductor chip 11-1. Although data input/output terminals other than IO0 and IO8 are not indicated in FIG. 9, data input/output terminals provided on the semiconductor device 10 as external connection terminals are connected with only one data input/output pad of the semiconductor chip 11-1 or 11-2 and are not connected with the other semiconductor chip.

A test pad 1 and a test pad 2 are provided on each of the semiconductor chips 11-1 and 11-2, and both of the test pads 1 and both of the test pads 2 are connected each other, respectively, via a test pad connection terminal provided on the circuit board 110. The test pad connection terminal provided on the circuit board 110 are used only for interconnection and therefore, the test pads of the semiconductor chips 11-1 and 11-2 can be connected directly with each other without using the test pad connection terminal provided on the circuit board 110, if possible. The test pad 1 and the test pad 2 are not necessarily provided as external connection terminals of the semiconductor device 10. The test pad 1 is a pad for transmitting a test result of the semiconductor chip 11-2 from the semiconductor chip 11-2 to the semiconductor chip 11-1. And the test pad 2 is a pad for transmitting a test write data from the semiconductor chip 11-1 to the semiconductor chip 11-2, as will be described later in detail.

When testing a plurality of semiconductor devices 10 in parallel using a test apparatus, only IO0 terminal among a plurality of data input/output terminals is connected with the test apparatus. Other data input/output terminals than IO0 are not connected with the test apparatus and are remained open. Therefore, the data input/output terminals of the semiconductor chip 11-2 are not connected with the test apparatus at all. When test writing operation, a write data input from the IO0 terminal is supplied by a test circuit in the semiconductor chip 11-1 to each data input/output buffer circuit of the semiconductor chip 11-1, and a test write data is output from the test pad 2(1). A test circuit of the semiconductor chip 11-2 receives the test write data from the test pad 2(2) and supplies the test write data to each data input/output buffer circuit. When test reading operation, a test result of the semiconductor chip 11-2 by the test circuit in the semiconductor chip 11-2 is output from the test pad 1(2). The test circuit of the semiconductor chip 11-1 receives the test result of the semiconductor chip 11-2 from the test pad 1(1) and synthesizes the test result with the test result of the semiconductor chip 11-1, and output the synthesized result from the data input/output pad DQ0(1) to outside. The circuit structures of the semiconductor chips 11-1 and 11-2 according to an example 1 for realizing the function described above will be explained in detail.

Figure 1:
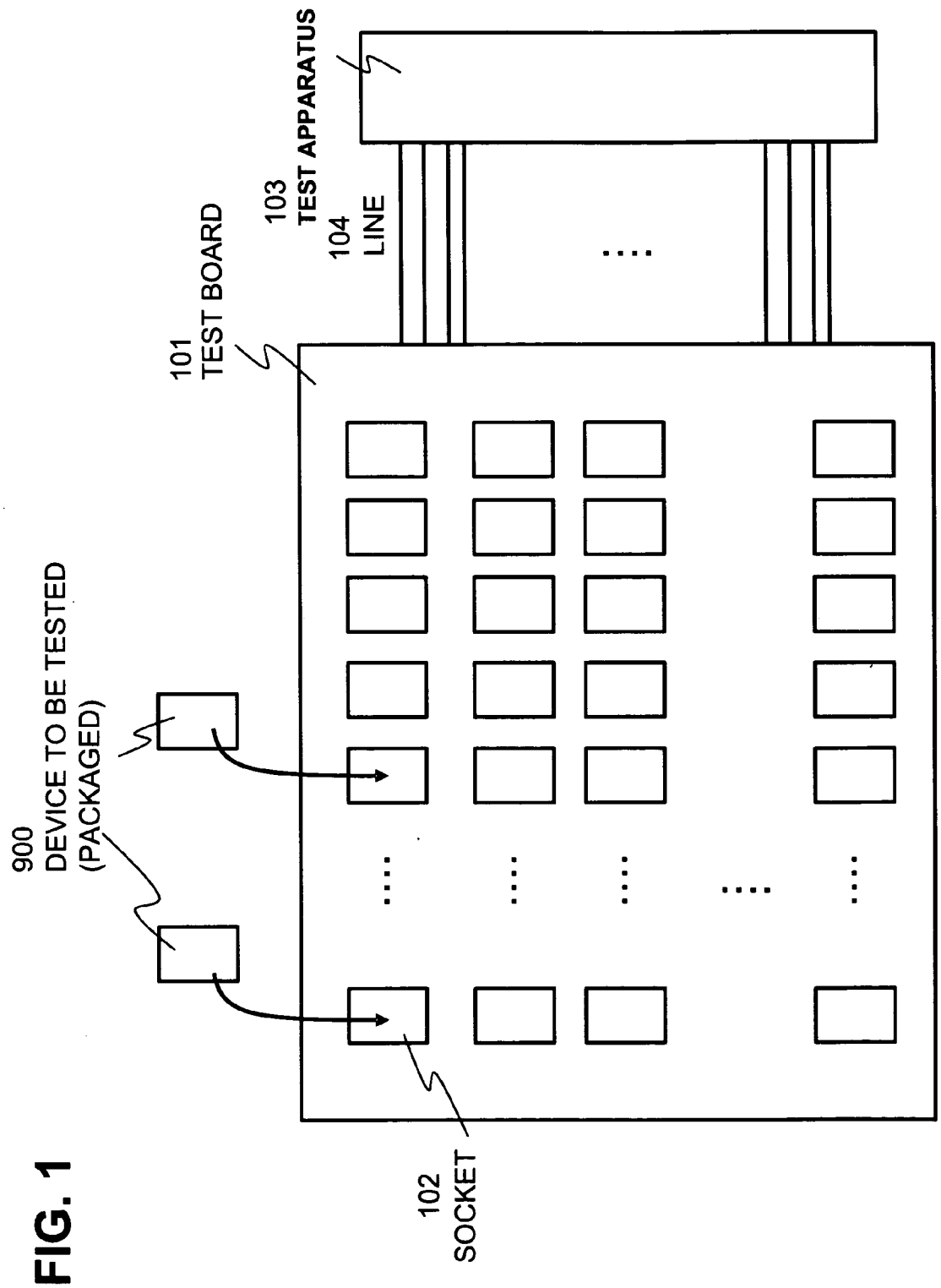
FIG. 1 is a schematic drawing of a test system for performing parallel tests of a plurality of semiconductor devices.
Figure 2:
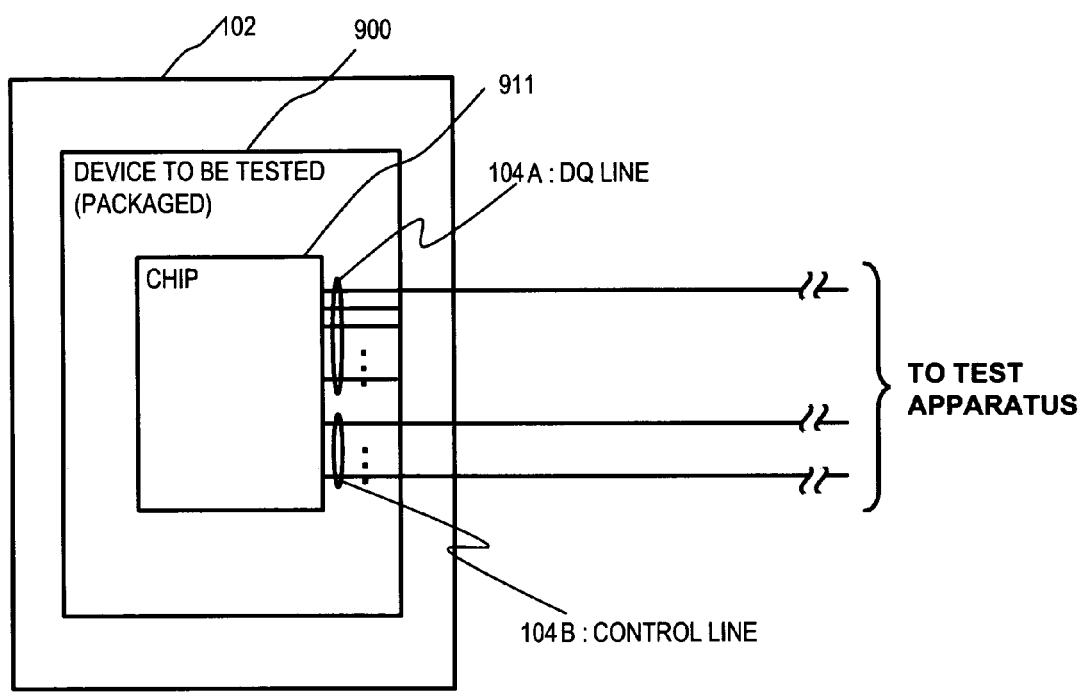
FIG. 2 is a wiring drawing around a semiconductor device according to FIG. 1 employing a test method for increasing the number of semiconductor devices to be tested in parallel.
Figure 3A:
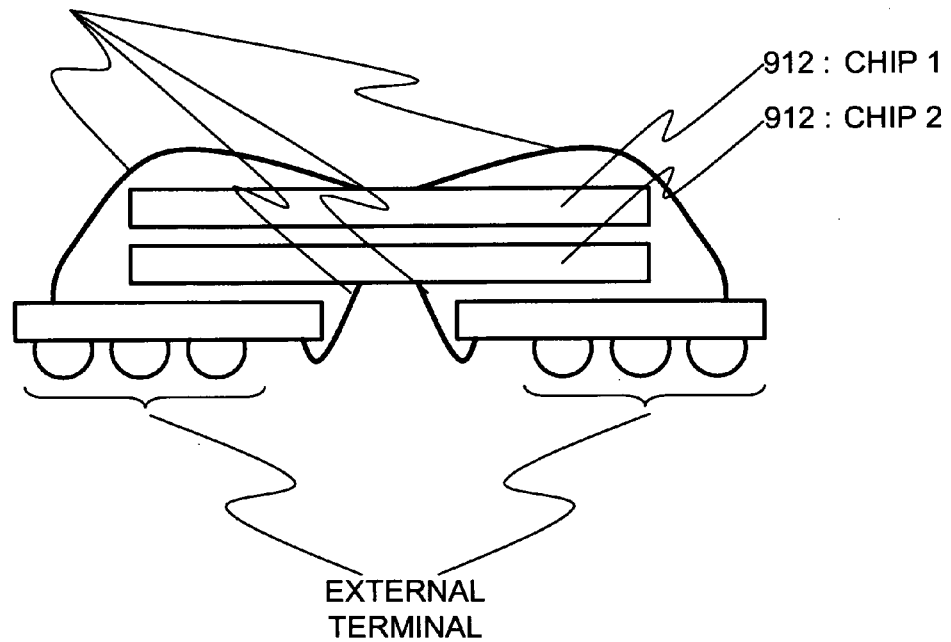
FIG. 3A is a sectional drawing and FIG. 3B is a perspective drawing, respectively, of a multi-chips packaged semiconductor device.
Figure 3B:
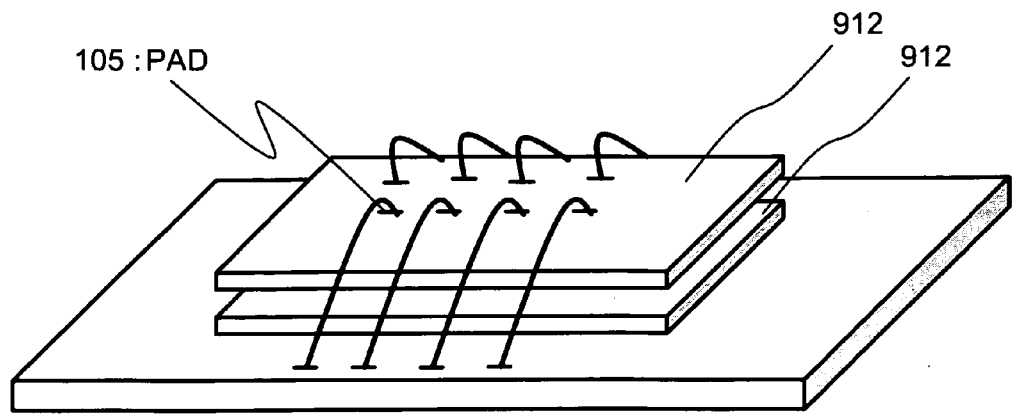
Figure 4:
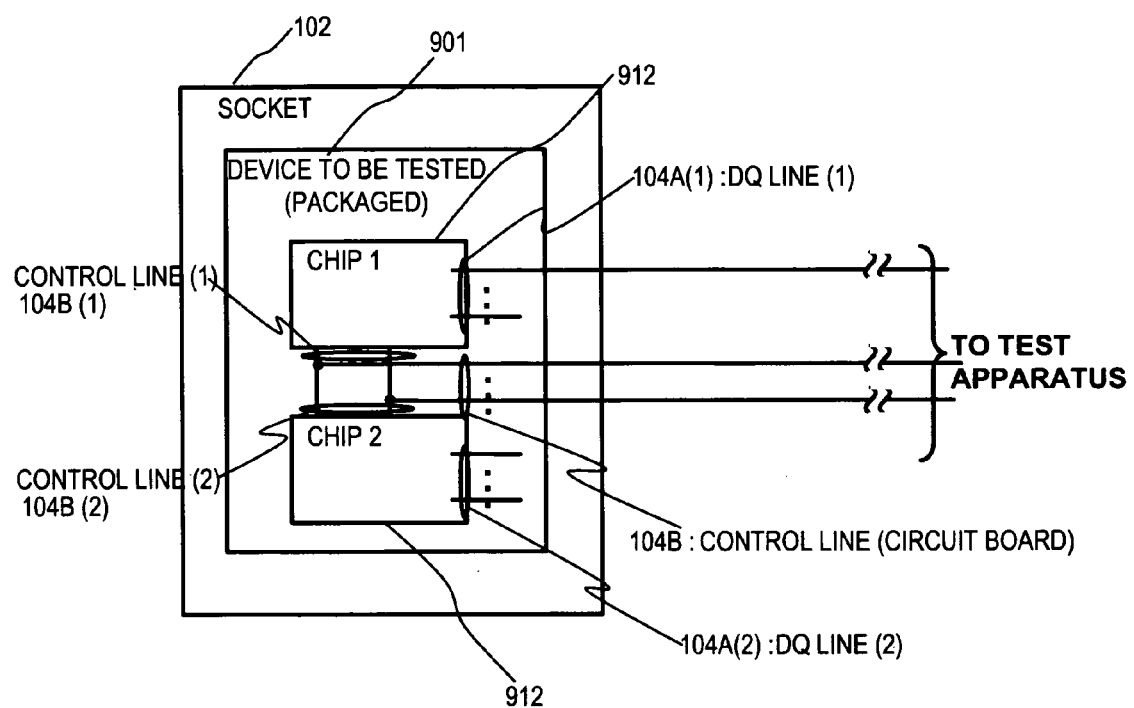
FIG. 4 is a drawing for explaining a problem of parallel tests of conventional multi-chips packaged semiconductor devices each data input/output pad of which is connected to an individual terminal.
Figure 5:
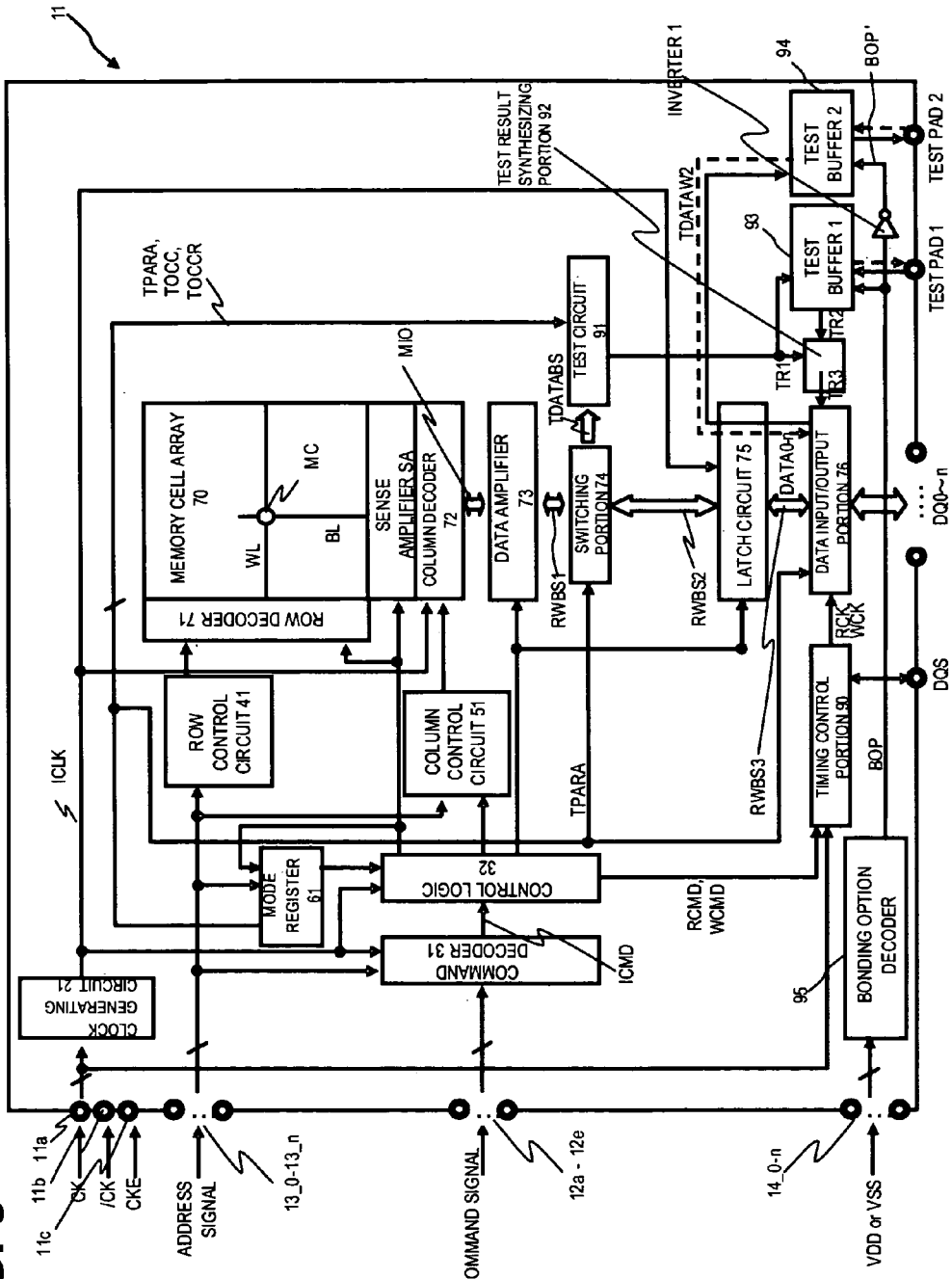
FIG. 5 is a circuit block diagram of the whole semiconductor chip according to an example 1 of the present invention.

FIG. 5 is a circuit block diagram of the whole of a semiconductor chip 11 according to an example 1 of the present invention. The semiconductor chip 11 is a semiconductor chip that can be used as either the semiconductor chip 11-1 or 11-2 in FIG. 9. In FIG. 5, clock pads 11a and 11b are for receiving external clock signals CK and /CK, respectively, and a clock enable pad 11c is for inputting a clock enable signal CKE. The external clock signals CK and /CK and the clock enable signal CKE are supplied to a clock generating circuit 21. In the present description, a signal having "/" at the beginning of its signal symbol means that it is an inversed signal or a low-active signal of corresponding signal. Therefore, the external signals CK and /CK are complementary signals. The clock generating circuit 21 generates an internal clock signal ICLK and the generated internal clock signal ICLK is supplied to every circuit block of the semiconductor chip.

Command pads 12a to 12e are pads for receiving row address strobe signal /RAS, column address strobe signal /CAS, write enable signal /WE, chip select signal /CS and on-die-termination signal ODT, respectively. Theses command signals are supplied to a command decoder 31.

Address pads 13_0 to 13_n are pads for receiving an address signal ADD, and the supplied address signal ADD is supplied to a row control circuit 41, a column control circuit 51, the command decoder 31 and a mode register 61 through an address input circuit, which is not depicted in the drawing. More specifically, a row address is supplied to the row control circuit 41 and a column address is supplied to the column control circuit 51 during a normal operation mode. In the case a state in the semiconductor chip entries in a mode register set, the address signal ADD is supplied to the mode register 61 and then the content of the mode register is renewed.

The command decoder 31 is a circuit for generating various kinds of internal commands ICMD by holding, decoding and counting a part of command signals and address signals in synchronism with the internal clock ICLK. The generated internal commands ICMD are supplied to various circuit blocks in the semiconductor chip through a control logic 32.

The control logic 32 controls operations of various circuit blocks based on the internal command ICMD supplied from the command decoder 31 and an output from the mode register 61 in synchronism with the internal clock signal ICLK.

An output from the row control circuit 41 is supplied to a row decoder 71. The row decoder 71 is a circuit for selecting a word line WL included in a memory cell array 70. A plurality of word lines WL and a plurality of bit lines BL intersect each other in the memory cell array 70 and memory cells MC are provided at the crossing points (one word line WL, 1-bit line BL and one memory cell MC only are shown in FIG. 5). The bit line BL is connected with corresponding sense amplifier SA.

An output from the column control circuit 51 is supplied to a column decoder 72. The column decoder 72 is a circuit for selecting a sense amplifier SA among a plurality of sense amplifiers SA. The sense amplifier SA selected by the column decoder 72 is connected with a data amplifier 73 via a main I/O line MIO. The data amplifier 73, during a read operation, additionally amplifies a read data RD amplified by the sense amplifier SA and supplies it to a switching portion 74 through a read/write bus RWBS1. On the other hand, during a write operation, the data amplifier 73 amplifies a write data WD supplied from the switching portion 74 through the read/write bus RWBS1 and supplies the write data to the sense amplifier SA.

The switching portion 74 is a circuit for selecting a latch circuit 75 or a test circuit 91 for supplying a data output from a data amplifier 73, that is, a read data RD. Specifically, when a parallel test signal TPARA output from the mode register indicates a parallel test mode, the switching portion 74 supplies the read data RD to the test circuit 91 as a test data TDATA1 via a test data bus TDATABS, and when the TPARA indicates other mode than the parallel test mode, the switching portion 74 supplies the read data RD to the latch circuit 75 via a read/write bus RWBS2.

The latch circuit 75 is a parallel/serial conversion circuit for converting parallel or serial of an input/output data between the switching portion 74 and a data input/output portion 76.

A timing control portion 90 includes a DLL (Delay Locked Loop) circuit for controlling data input/output timing and, during a read operation, outputs a read timing signal RCK for controlling a timing of data readout at the data input/output portion 76 based on a read command RCMD and external clock signals CK and /CK supplied from the control logic 32 and, at the same time, outputs a data strobe signal to the outside via a data strobe pad DQS at the same time. On the other hand, during a writing operation, the timing control portion 90 supplies a write timing signal WCK, for controlling a timing of taking a write data at the data input/output portion 76, to the data input/output portion 76 based on the write command WCMD supplied from the control logic 32, external clock signals CK and /CK and a data strobe signal DQS supplied from outside through the data strobe pad DQS.

The mode register 61, when the internal command signal ICMD is indicating mode register set, becomes a state that a set value can be overwritten by a control signal supplied from the control logic 32 and the set value is overwritten to a specified code supplied from an address pad. Particularly, when the internal command ICMD is indicating test mode register set (TMRS), the mode register turns its state to be able to overwrite a test mode and, during this state, states of signals (parallel test signal TPARA, on-chip comparison signal TOCC and on-chip comparison output signal TOCCR) for various tests are changed by a specified test code supplied to an address pad.

The data input/output portion 76, at a read time during a normal operation mode, outputs a plurality of read data RD supplied from the read/write bus RWBS3 composed of a plurality of lines to outside via a plurality of data pads DQ0 to DQn. The data input/output portion 76, at a write time during a normal operation mode, outputs a plurality of write data WD input via the plurality of data pads DQ0 to DQn to the read/write bus RWBS3.

On the other hand, at a read time of a test result during a test operation mode, the data input/output portion 76 outputs a test result signal TR3 supplied from a test result synthesizing portion 92 to outside via one data pad among the plurality of DQ pads DQ0 to DQn. At a test write time during a test operation mode, the data input/output portion 76 supplies a test write data TD input from one DQ pad among the plurality of DQ pads DQ0 to DQn to the plurality of lines of the read/write bus RWBS3 and, at the same time, supplies the test write data TD to a test buffer 2 (94). A detailed structure of the data input/output portion 76 will be explained later in detail.

A bonding option decoder 95 outputs a bonding option signal BOP corresponding to a source voltage and a grounding voltage supplied from bonding option pads 14_0 to 14_n to a test buffer 1 (93) and outputs the bonding option signal BOP to the test buffer 2 (94) as a bonding option signal BOP' through an inverter 1.

The test buffer 1 (93) functions as an input buffer or an output buffer according to a logic level of the bonding option signal BOP. When functioning as an input buffer, the test buffer 1 supplies a test result signal TR2 (a second test result) of the other chips input from a test pad 1 to a test result synthesizing portion 92 (a third test circuit). When functioning as an output buffer, a test result signal TR1 (a first test result) of the chip itself output from a test circuit 91 (a first test circuit or a second test circuit) is output to the test pad 1 as a test result signal TR2. The test buffer 1, an input/output direction of which is fixed by a bonding option, functions as a test result input/output buffer 93 for inputting or outputting the test result signal TR2.

The test buffer 2 (94) is a circuit functioning as an input buffer or an output buffer according to a logic level of the bonding option signal BOP. When functioning as an input buffer, the test buffer 2 supplies a test write data TDATAW2 input from the test pad 2 to the data input/output portion 76. When functioning as an output buffer, the test buffer 2 outputs a test write data TDATAW2 output from the data input/output portion 76 to the test pad 2. The test buffer 2, an input/output direction of which is fixed by a bonding option, functions as a test write data input/output buffer 94 for inputting or outputting the test write data.

The test result synthesizing portion 92, when the test buffer 1 functions as an input buffer, logically operates a logic level of the test result signal TR2 of the other chips supplied from the test buffer 1 and a logic level of a test result signal TR1 as a test result of the chip itself output from the test circuit, and outputs the result as a test result signal TR3 (a third test result) to the data input/output portion 76.

The test circuit 91, when a parallel test signal TPARA output from the mode register 61 indicates a parallel test mode, logically operates a logic level of a plurality of test data TDATA1 supplied from the switching portion 74 via a test data bus TDATABS and outputs the result as a 1-bit test result signal TR1 to the test buffer 1 and the test result synthesizing portion 92.

Figure 6A:
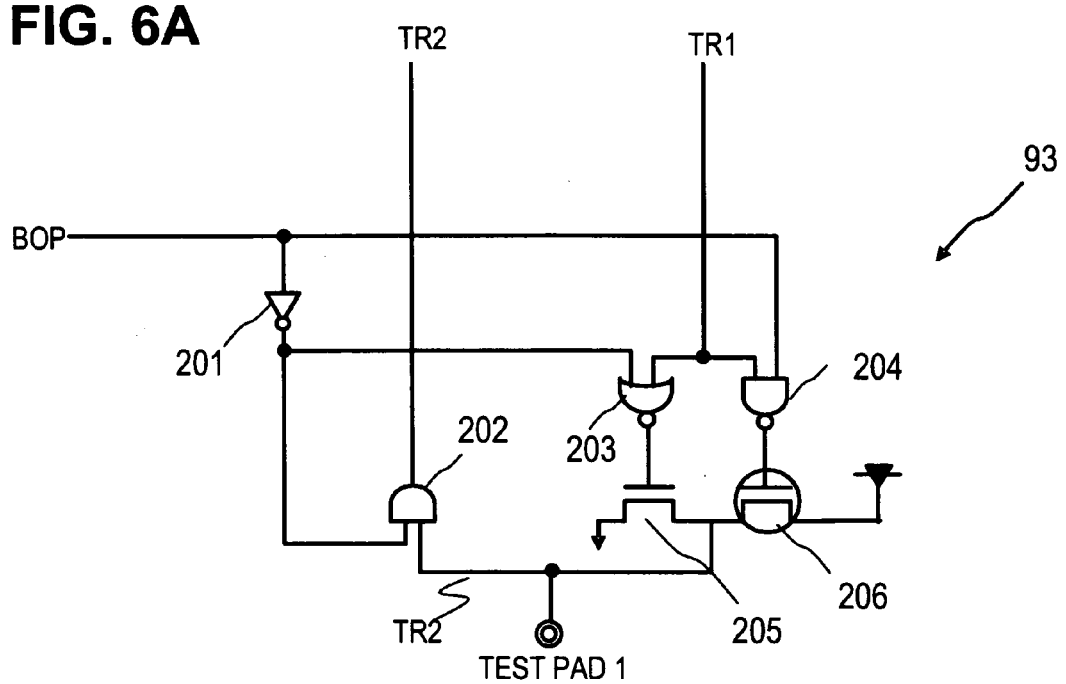
FIG. 6A is a circuit block diagram of a test buffer 1 (test result input/output buffer) and FIG. 6B is a circuit block diagram of a test buffer 2 (test write data input/output buffer), respectively, according to an example 1.

FIG. 6A is a circuit block diagram of the test buffer 1 (test result input/output buffer 93) in FIG. 5. The test buffer 1 is a test result input/output buffer 93 connected with the test pad 1 and functions as an output buffer for outputting the test result signal TR1 from the test pad 1 or as an input buffer for inputting a signal input from the test pad 1 as a test result signal TR2 according to a logic level of the bonding option signal BOP.

When the bonding option signal BOP is high level, an output of an AND circuit 202 is always low level that causes the AND circuit 202 becomes inactive and the test buffer 1 does not function as an input buffer. In this case outputs of a NOR circuit 203 and a NAND circuit 204 change according to a logic level of the test result signal TR1, which means that the test buffer 1 functions as an output buffer.

When the bonding option signal BOP is low level, an output of the AND circuit 202 changes in response to the test result signal TR2 input from the test pad 1, which means that the test buffer 1 functions as an input buffer. In this case an output of the NOR circuit 203 is always low level and an output of the NAND circuit 204 is always high level and therefore, the NOR circuit 203 and the NAND circuit 204 becomes inactive and the test buffer 1 does not function as an output buffer.

Figure 6B:
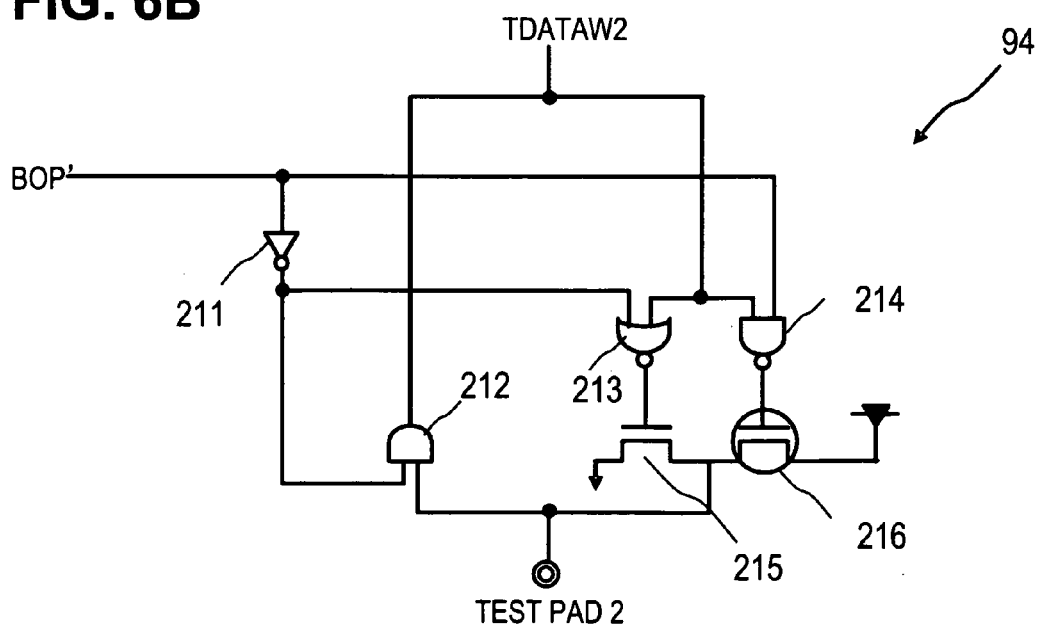

FIG. 6B is a circuit block diagram of the test buffer 2 (test write data input/output buffer 94) in FIG. 5. The test buffer 2 is a test write data input/output buffer 94 connected with the test pad 2 and functions as an output buffer for outputting a test write data TDATAW2 from the test pad 2 or as an input buffer for inputting a signal input from the test pad 2 as a test write data TDATAW2 according to a logic level of the bonding option signal BOP'.

When the bonding option signal BOP' is high level, an output of an AND circuit 212 is always low level that causes the AND circuit 212 becomes inactive and the test buffer 2 does not function as an input buffer. In this case outputs of a NOR circuit 213 and a NAND circuit 214 change according to a logic level of the test write data TDATAW2, which means that the test buffer 2 functions as an output buffer that outputs the test write data to outside.

When the bonding option signal BOP' is low level, an output of the AND circuit 212 varies according to a logic level of the test write data input from the test pad 2, which means that the test buffer 2 functions as an input buffer. In this case an output of the NOR circuit 213 is always low level and an output of the NAND circuit 214 is always high level and therefore, the NOR circuit 213 and the NAND circuit 214 becomes inactive and the test buffer 2 does not function as an output buffer.

Figure 7:
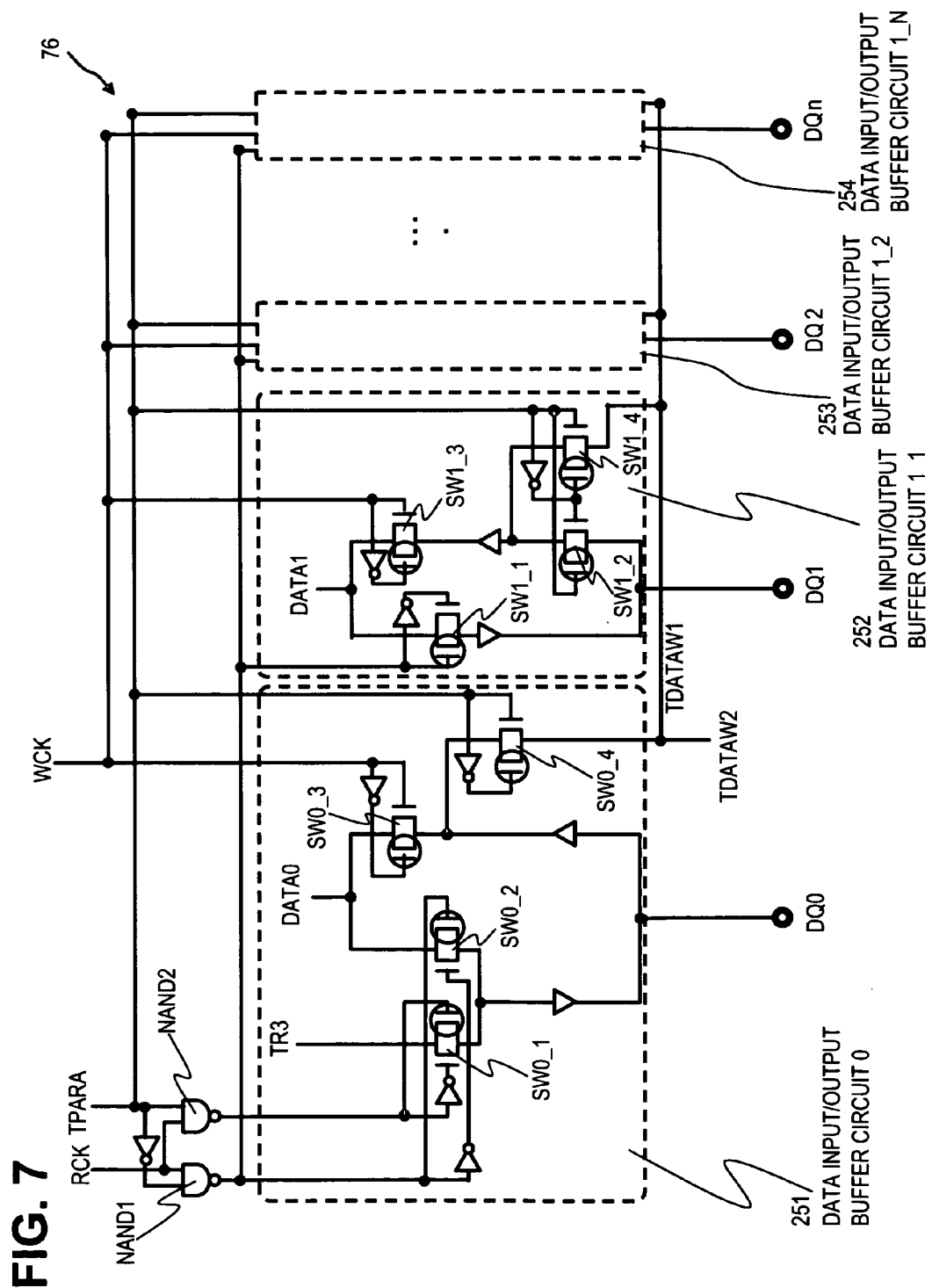
FIG. 7 is a circuit block diagram of a data input/output portion according to an example 1.

FIG. 7 is a circuit block diagram of the data input/output portion 76 in FIG. 5. The data input/output portion in FIG. 5 is provided with data input/output buffer circuits 251 to 254 corresponding to n-bit (n is an integer equal to or greater than 2) data input/output pads (DQ0 to DQn). The number of the data input/output buffer circuits 251 to 254 is the same as the number of the bit (n) of the data input/output portion. Some data input/output buffer circuits between 253 and 254 are omitted in the drawing; however, appropriate numbers of data input/output buffer circuits are provided between the data input/output buffer circuits 253 and 254 corresponding to the number of the bit (n) of data input/output pads. The data input/output buffer circuits 251 to 254 are connected with the corresponding data input/output pads (DQ0 to DQn) and read/write lines DATA0 to DATAn. A read timing signal RCK and a write timing signal WCK, for controlling read/write timing during a normal operation mode, are connected. In addition, a parallel test signal TPARA for a control signal during a test operation and a test write data TDATAW2 for a write data signal during a test operation are connected with each of the data input/output buffer circuits 251 to 254. An output node of the test result synthesizing portion 92 is connected with the $0^{th}$ bit data input/output buffer circuits 251 for receiving a test result signal TR3 supplied from the test result synthesizing portion 92.

A structure of the data input/output buffer circuits 251 is slightly different from other circuits because the circuit 251 is connected with data input/output pad DQ0 which is connected with a test apparatus at a parallel test operation; however, structures of the other data input/output buffer circuits 252 to 254 are the same. Therefore, the structures of the data input/output buffer circuits 253 and 254 are not depicted in the drawing because they are the same as that of the data input/output buffer circuit 252.

The parallel test signal TPARA supplied from the mode register 61 to the data input/output portion 76 shown in FIG. 7 becomes low level at a normal operation mode. Then switches SW0_4 and SW1_4 to SWn_4 become non-conductive. Also a switch SW0_1 becomes non-conductive because an output of the NAND2 is fixed to high level. An output of the NAND1 varies according to a logic level of the read timing signal RCK during a normal operation mode. Switches SW1_2 to SWn_2 are in continual conductive state and switches SW1_4 to SWn_4 are in continual non-conductive state. When reading operation, read data supplied to a plurality of read/write lines DATA0 to DATAn that is the read/write bus RWBS3 are output to corresponding DQ pads DQ0 to DQn by making the read timing signal RCK high level to be in active state at a determined timing and making the switches SW0_2 and SW1_1 to SWn_1 in conductive state. When writing operation, a plurality of write data supplied to the plurality of DQ pads DQ0 to DQn are supplied to the plurality of read/write lines DATA0 to DATAn by making the write timing signal WCK high level to be in active state at a determined timing and making the switches SW0_3 and SW1_3 to SWn_3 in conductive state.

During a parallel test operation mode, the parallel test signal TPARA becomes high level to be active. In this case, an output of NAND1 in FIG. 7 is fixed high level and the switches SW0_2 and SW1_1 to SWn_1 become non-conductive. In this case, an output of the NAND2 varies according to a logic level of the read timing signal RCK. The switches SW1_2 to SWn_2 are in continual non-conductive state and the switches SW1_4 to SWn_4 are in continual conductive state. When reading the test result, the test result signal TR3 supplied from the test result synthesizing portion is output from the DQ pad DQ0 by making the read trimming signal RCK high level to be in active state at a determined timing and making the switches SW0_1 in conductive state.

When writing the test write data, the parallel test signal TPARA is high level to be in active state and therefore, the switch SW0_4 is in continual conductive state. The switches SW0_3 and SW1_3 to SWn_3 become conductive according to a logic level of the write timing signal WCK. In the case the test buffer 2 (94) functions as an output buffer, the test write data TD supplied from the DQ pad DQ0 is supplied to the read/write line DATA0 through the data input/output buffer circuit 0 (251). Also the test write data TD supplied from the DQ pad DQ0 is supplied as TDATAW1 to the data input/output buffer circuits 1 to n through the data input/output buffer circuit 0 (251), and then supplied to the plurality of read/write lines DATA1 to DATAn through the data input/output buffer circuits 1 to n. In addition, the test write data TD supplied from the DQ pad DQ0 is supplied as TDATAW2 to the test buffer 2 (test write data input/output buffer 94) of FIG. 6B through the data input/output buffer circuit 0 (251).

In the case the test buffer 2 (94) functions as an input buffer, the test write data TDATAW2 input from the test buffer 2 (94) is supplied to the plurality of read/write lines DATA0 to DATAn through the data input/output buffer circuits 0 (251) to n (254). In the case the test buffer 2 (94) functions as an input buffer, a switch forming a counterpart to the SW0_4 can be provided between the DQ0 pad and the SW0_3, just the same as the SW1_4 and SW1-2 in the data input/output buffer circuit 252, so as to prevent a short between data input from the DQ0 pad and the test write data TDATAW2, although it is not shown in FIG. 7.

As is already explained using FIG. 9, only DQ0 pad on one semiconductor chip (semiconductor chip 11-1 in FIG. 9) among the plurality of DQ pads on two semiconductor chips in the semiconductor package is connected with a measurement pin of the test apparatus at the parallel test. In the case shown in FIG. 9, the voltage supplied to the bonding option pad of the semiconductor chip 1 is set such that the test buffer 1 functions as an input buffer and the test buffer 2 functions as an output buffer. On the other hand, the voltage supplied to the bonding option pad of the semiconductor chip 2 in FIG. 9 is set such that the test buffer 1 functions as an output buffer and the test buffer 2 functions as an input buffer.

Figure 8A:
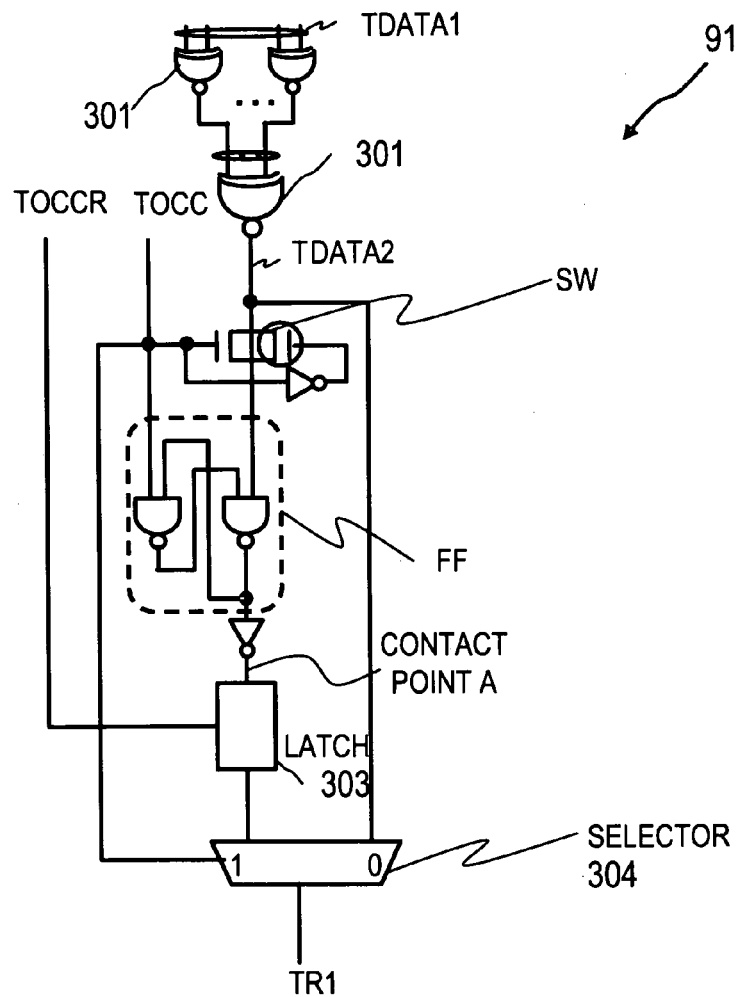
FIG. 8A is a test circuit block diagram and FIG. 8B is a circuit block diagram of a test result synthesizing portion, respectively, according to an example 1.

FIG. 8A is a block diagram of the test circuit 91 according to an example 1 of the present invention. The test circuit 91 shown in FIG. 8A contains a decision circuit including exclusive NOR circuits 301 for comparing test data of multiple bit read data TDATA1 readout from a memory portion including the memory cell array 70 and decides one pattern fail/safe, a set/reset circuit FF for compacting a plurality of test result patterns, a latch 303 for outputting an output from the set/reset circuit FF in synchronism with an on-chip comparison output signal TOCCR, and a selector 304. The selector 304 selects based on the on-chip comparison signal whether the test result should be output without compaction, that is, every decision of the decision circuit corresponding to every readout command is output as it is, or the test results should be compacted by the set/reset circuit FF, that is, a plurality of test results corresponding to a plurality of readout commands should be synthesized and output (a pass result is output when all of the test results are safe and a fail result is output when at least one test result is fail). A switch SW is provided between the decision circuit and the set/reset circuit FF.

A test data comparison portion (decision circuit) logically operates logic levels of the plurality of test data TDATA1 supplied from the switching portion 74 of FIG. 5 through the test data bus TDATABS and supplies the result as 1-bit test data TDATA2 to the set/reset circuit FF and the selector 304. Specifically, if all of the plurality of test data TDATA1 have the same logic levels, a high level test data TDATA2 is output and if at least one of the plurality of test data TDATA1 has a different logic level from others, a low level test data TDATA2 is output. When the test data TDATA2 is high level, it is decided that the semiconductor chip is good (pass) and when the test data is low level, it is decided that the semiconductor chip is not good (fail).

The switch SW is non-conductive when the on-chip comparison signal TOCC is low level, which is an inactive level, and is conductive when the on-chip comparison signal TOCC is high level, which is an active level.

The set/reset circuit FF is connected with the switch SW, and when the on-chip comparison signal TOCC supplied from the mode register 61 in FIG. 5 becomes low level as an inactive level while an input node for receiving the test data TDATA2 is in high level, an output of the set/reset circuit FF is reset to be low level as an initial logic level. When the TDATA2 signal transfers from high level to low level while the on-chip comparison signal TOCC is in high level as an active level, the output of the set/reset circuit FF is changed from low level to high level and the output level is kept in high level until the on-chip comparison signal TOCC becomes low level even when the TDATA2 signal becomes high level again from low level. When the TDATA2 signal does not transfer to low level from high level while the on-chip comparison signal TOCC is in high level as an active level, the output of the set/reset circuit FF is kept in low level. While the on-chip comparison signal TOCC is inactive level, the output of the set/reset circuit FF can be remained stable, even when an on-chip comparison test is not carried out, by pre-charging a line provided between the switch SW and the set/reset circuit FF, that is, the input node of the set/reset circuit FF connected with the switch SW and for receiving the test data TDATA2, to be high level using a pre-charge circuit which is not shown in the drawing.

The latch 303 outputs to the selector an output signal supplied from the set/reset circuit FF via an inverter in response to a rising edge of the on-chip comparison output signal TOCCR, and transfers its own output to low level as an initial level by a falling edge of the on-chip comparison output signal TOCCR.

The selector 304 outputs an output of the latch 303 as a test result signal TR1 when the on-chip comparison signal TOCC is high level, and outputs an output of the test data comparison portion (decision circuit), or TDATA2 as a test result signal TR1 when the on-chip comparison signal TOCC is low level.

There are two kinds of parallel tests, which are non-on-chip comparison test (referred to as "para-test" hereinafter) and on-chip comparison test. The para-test is carried out by reading-out the test data TDATA1 from a memory cell corresponding to an address at each time when a read command is input during a parallel test operation mode, comparing the result at the test data comparison portion (deciding at the decision circuit), and outputting the test result to outside through the data input/output portion and DQ0 pad at each time when the read command is input. On the other hand, the on-chip comparison test is carried out by reading-out the test data TDATA1 from a memory cell corresponding to an address at each time when a read command is input and comparing the result at the test data comparison portion, which are the same steps as the para-test as described above, and then outputting the test result to outside only when the on-chip comparison output signal TOCCR is activated instead of each time when the read command is input. According to the on-chip comparison test, a test data is readout and compared in multiple times by changing the address, and after that the test result is output to outside as a 1-bit test result signal of pass or fail. Thus when all of the plurality of the reading and comparison test operations are good (pass), a good (pass) test result is output and when at least one reading and comparison operation is decided as a fail, a fail test result is output.

Figure 8B:
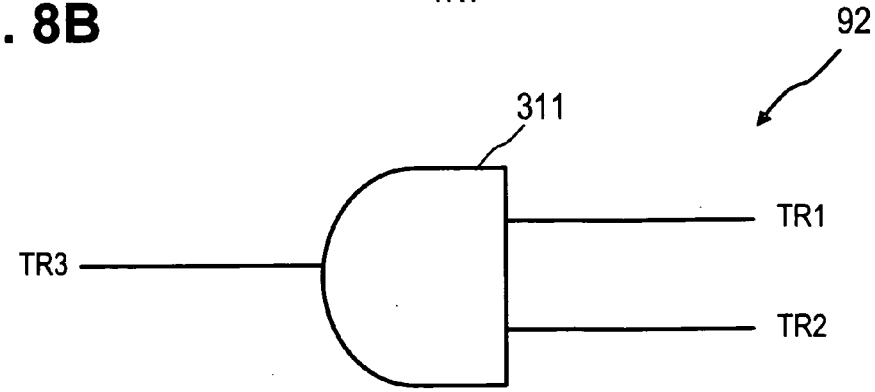

FIG. 8B is a block diagram of the test result synthesizing portion 92 of an example 1. The test result synthesizing portion 92 receives the test result signal TR1 of the semiconductor chip itself output from the test circuit 91 and a test result signal TR2 of the other semiconductor chip input from the test pad 1 through the test buffer 1, and operates logic AND to output as a test result signal TR3. Each of the TR1 signal and TR2 signal becomes high level when the result is a pass and low level when the result is a fail. Thus, the test result signal TR3 becomes high level when both of the chip itself and the other semiconductor chip are pass and becomes low level when at least one of the chip itself and the other semiconductor chip is fail.

The structure of the semiconductor device 10 explained with FIGS. 5 to 9 is summarized as follows. As to the semiconductor chip 11-1 in FIG. 9, the test buffer 1 (93) of FIG. 6A is set as an input buffer by the bonding option BOP and the test buffer 2 (94) of FIG. 6B is set as an output buffer by the bonding option BOP'. As to the semiconductor chip 11-2 in FIG. 9, to the contrary, the test buffer 1 (93) is set as an output buffer and the test buffer 2 (94) is set as an input buffer.

When writing a test data, write data sent from a test apparatus is taken from the DQ0 pad of the semiconductor chip 11-1 through the data input/output buffer circuit 251 of the semiconductor chip 11-1 shown in FIG. 7 as test write data TDATAW1 and TDATAW2, and connected with the data input/output buffer circuits 251 to 254 of each bit. The test data TDATAW2 is output from the test buffer 2 (94) shown in FIG. 6B. On the other hand, the test write data TDATAW2 outputted from the semiconductor chip 11-1 is taken into the semiconductor chip 11-2 from the test buffer 2 (94) of the semiconductor chip 11-2. The data input/output buffer circuits 251 to 254 of the semiconductor chip 11-2 take into the test write data TDATAW2 and write in each bit of the semiconductor chips 11-1 and 11-2.

When reading a test data, a test result of the semiconductor chip 11-2 is output from the test circuit 91 of FIG. 8A as a test result signal TR1, and output from the test buffer 1 (93) of FIG. 6A to outside of the semiconductor chip 11-2. The semiconductor chips 11-1 takes a test result signal of the semiconductor chip 11-2 as a TR2 from the test buffer 1 (93) and outputs a test result of the chip itself by the test circuit 91 as a test result signal TR1. The test result synthesizing portion 92 shown in FIG. 8B synthesizes the test result signal TR1 and the test result signal TR2 into a test result signal TR3, which is output to a test apparatus from the data input/output buffer circuit 251 of FIG. 7.

Figure 10:
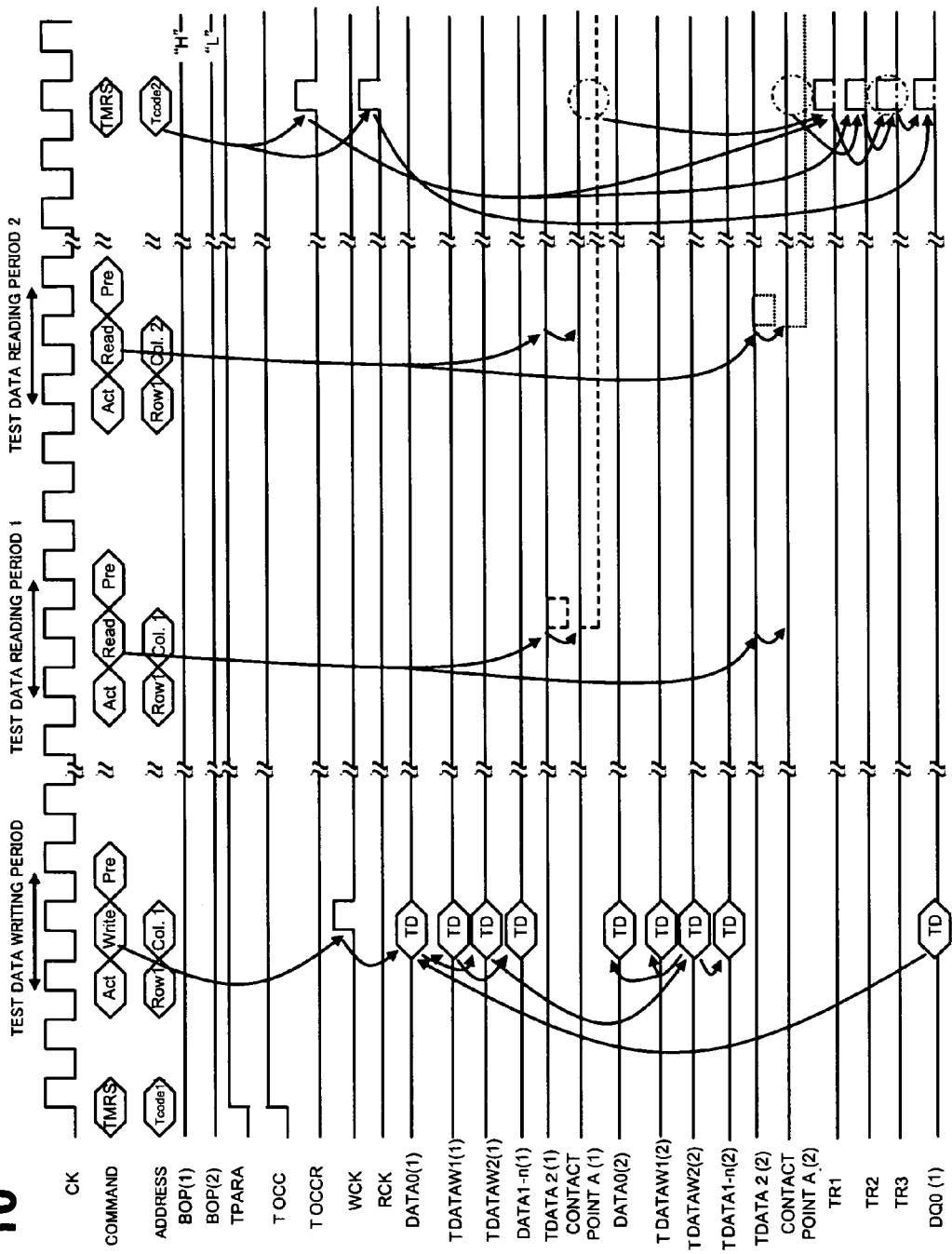
FIG. 10 is an operation wave form diagram of an on-chip comparison (OCC) test according to an example 1.

Next, operations of two parallel tests, which are the on-chip comparison test and the para-test, are explained in more detail by way of operation wave form diagram. FIG. 10 is an operation wave form diagram of an on-chip comparison (OCC) test according to an example 1. A signal name having a symbol (1) at the end means that it is a signal of the semiconductor chip 11-1 and a signal name having a symbol (2) at the end means that it is a signal of the semiconductor chip 11-2. A contact point A is an output signal that an output signal from the set/reset circuit FF shown in FIG. 8A is inverted by an inverter. The signal, at the on-chip comparison test, becomes high level when the on-chip comparison signal TOCC is low level, and falls down to low level when the decision circuit (301, etc.) detects a fail while the on-chip comparison signal TOCC is high level and keeps its low level state until the on-chip comparison signal TOCC becomes low level.

According to an example shown by FIG. 10, after writing a test data into a plurality of memory cells repeatedly by changing addresses, the test data is readout repeatedly by changing the addresses, and then test code 2 Tcode2 is input by a test mode reset command TMRS. The on-chip comparison output signal TOCCR and the read timing signal RCK are activated, by the procedure above explained, and the test result is output to outside. Alternatively, the test result may be output by activating the on-chip comparison output signal TOCCR and the read timing signal RCK by repeating a test cycle (one test cycle is consisted of writing a data into a specified address and reading the data from the address) and then inputting a test code 2 Tcode2.

According to FIG. 10, at first, the on-chip comparison test mode is set by inputting a test mode register set command TMRS, setting the mode register 61 by a test code Tcode1 input from the address input terminal, and setting the parallel test signal TPARA and the on-chip comparison signal TOCC high level from low level. The set/reset circuit FF in the test circuit of FIG. 8A is reset because the on-chip comparison signal TOCC is set from low level to high level.

Next, a bank address and a row address are designated by an ACT command. In addition, a column address is designated and data input from the DQ0 pad of the semiconductor chip 11-1 are written into a plurality of memory cells in parallel of the semiconductor chips 11-1 and 11-2 designated by the bank address, row address and column address by a write command. The writing of the test data is carried out repeatedly by changing the addresses (and data, if necessary). After that an ACT command and a read command are input and data in designated address is read. However, a test result is not output unless the on-chip comparison output signal TOCCR is set in high level by a test mode register set command TMRS because it is an on-chip comparison test. Nonetheless, the set/reset circuit FF of the test circuit 91 of each semiconductor chip is set when a fail is decided, that is, an output of itself is changed from low level to high level and therefore, the test result can be stored. Reading is repeated in necessary times by changing addresses. Finally, the on-chip comparison output signal TOCCR is set in high level by the test mode register set command TMRS and the test result synthesizing portion 92 of the semiconductor chip 11-1 synthesizes the test results of the semiconductor chips 11-1 and 11-2 and outputs from the DQ0 pad.

Although it is not shown in FIG. 10, after outputting the test result, the TPARA and TOCC become low level as an inactive level by inputting a test code for ending the parallel test to the mode register 61 by the test mode reset command TMRS, which results in returning to an initial state of FIG. 10.

Figure 11:
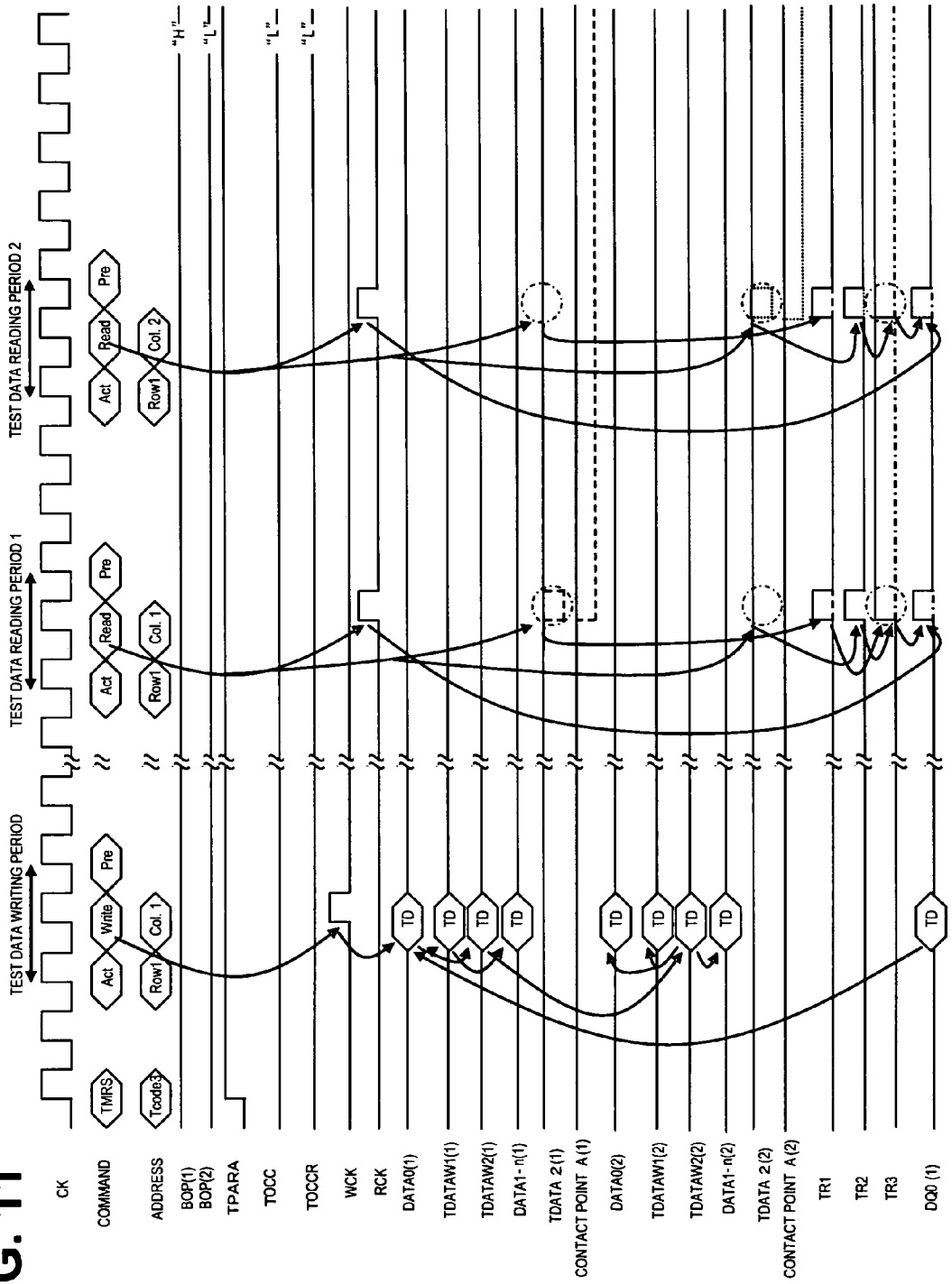
FIG. 11 is an operation wave form diagram of a para-test (parallel test) according to an example 1.

FIG. 11 is an operation wave form diagram of the para-test (parallel test) according to an example 1. Explanations of the para-test whose test methods are almost common to those of the on-chip comparison test are omitted. According to the on-chip comparison test, the on-chip comparison signal TOCC is set high level from low level at the first inputting of the test mode reset command TMRS; however, the on-chip comparison signal TOCC is not set high level at the para-test. Therefore, the selector 304 of the test circuit 91 of FIG. 8A outputs the decision of the decision circuit as it is. Thus when a fail occurred at a bit of the semiconductor chips 11-1 or 11-2 during executing the read command, a test result is synthesized at the test result synthesizing portion 92 of the semiconductor chip 11-1 and the synthesized result is output from the DQ0 pad at each time.

According to FIG. 11, after writing test data into a plurality of memory cells by changing addresses, the test data is readout repeatedly by changing the addresses. However, as is explained in the on-chip comparison test, repeating a test cycle (one test cycle includes writing a data into a specified address and reading the data from the address) may be possible. When the test completed, the parallel test signal TPARA is set low level as an inactive level by inputting the test mode register set command TMRS, which results in returning to an initial state of FIG. 11, as is explained in the on-chip comparison test.

Example 2

Figure 15:
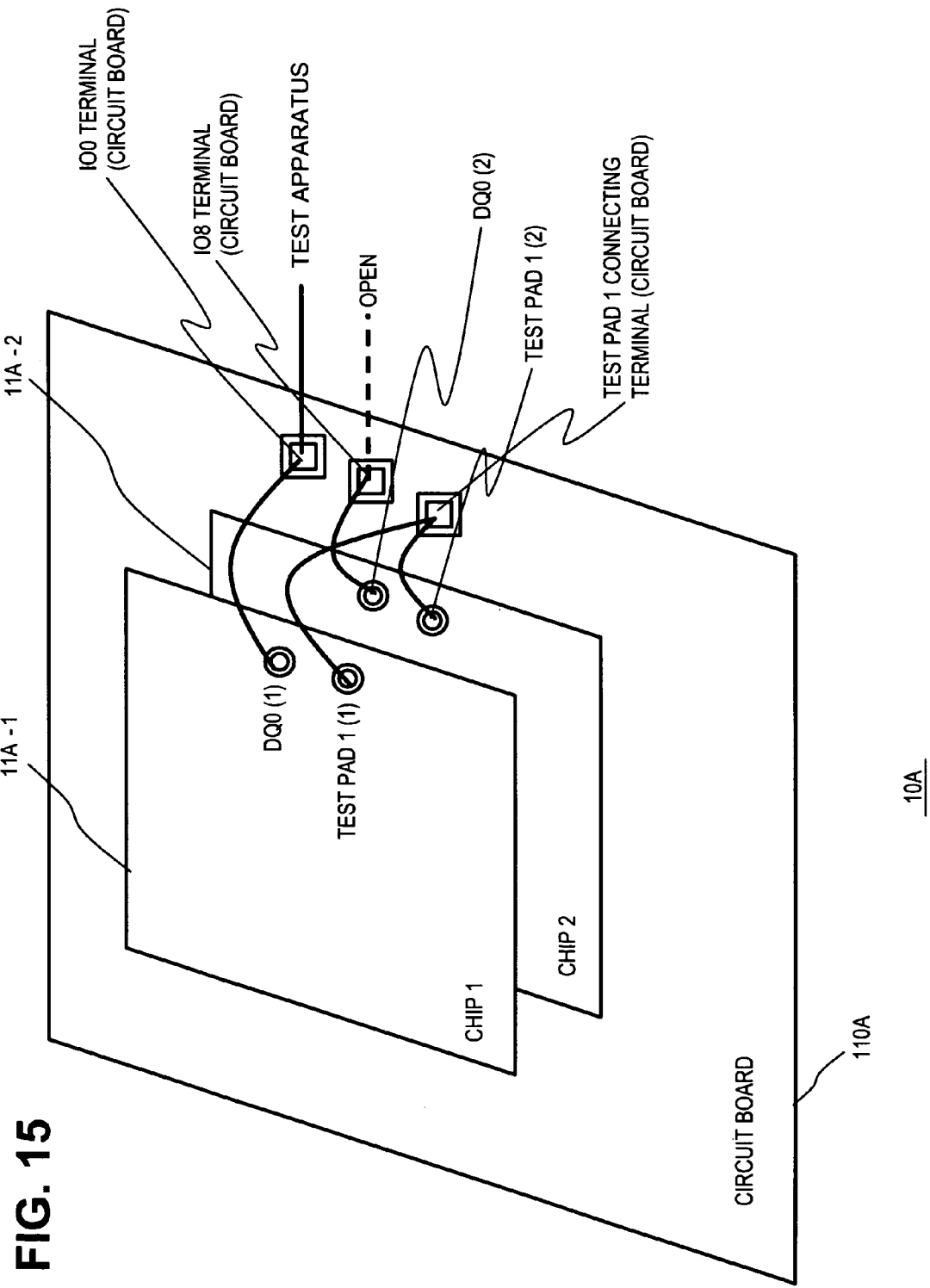
FIG. 15 is a schematic drawing of line connections of a semiconductor device according to an example 2.

FIG. 15 is a schematic drawing of line connections of a semiconductor device 10A according to an example 2. In FIG. 15, the same symbol is assigned for a portion of almost the same structure as that of an example 1 shown in FIG. 9 and an explanation is omitted. A test pad 2 is not provided on the semiconductor chips 11A-1 and 11A-2 in FIG. 15, although it was provided on the semiconductor chips 11-1 and 11-2 of an example 1. Accordingly, a connecting terminal for a test pad 2 is not provided on a circuit board 110A. Other structures are the same as the semiconductor device 10 of an example 1.

Figure 12:
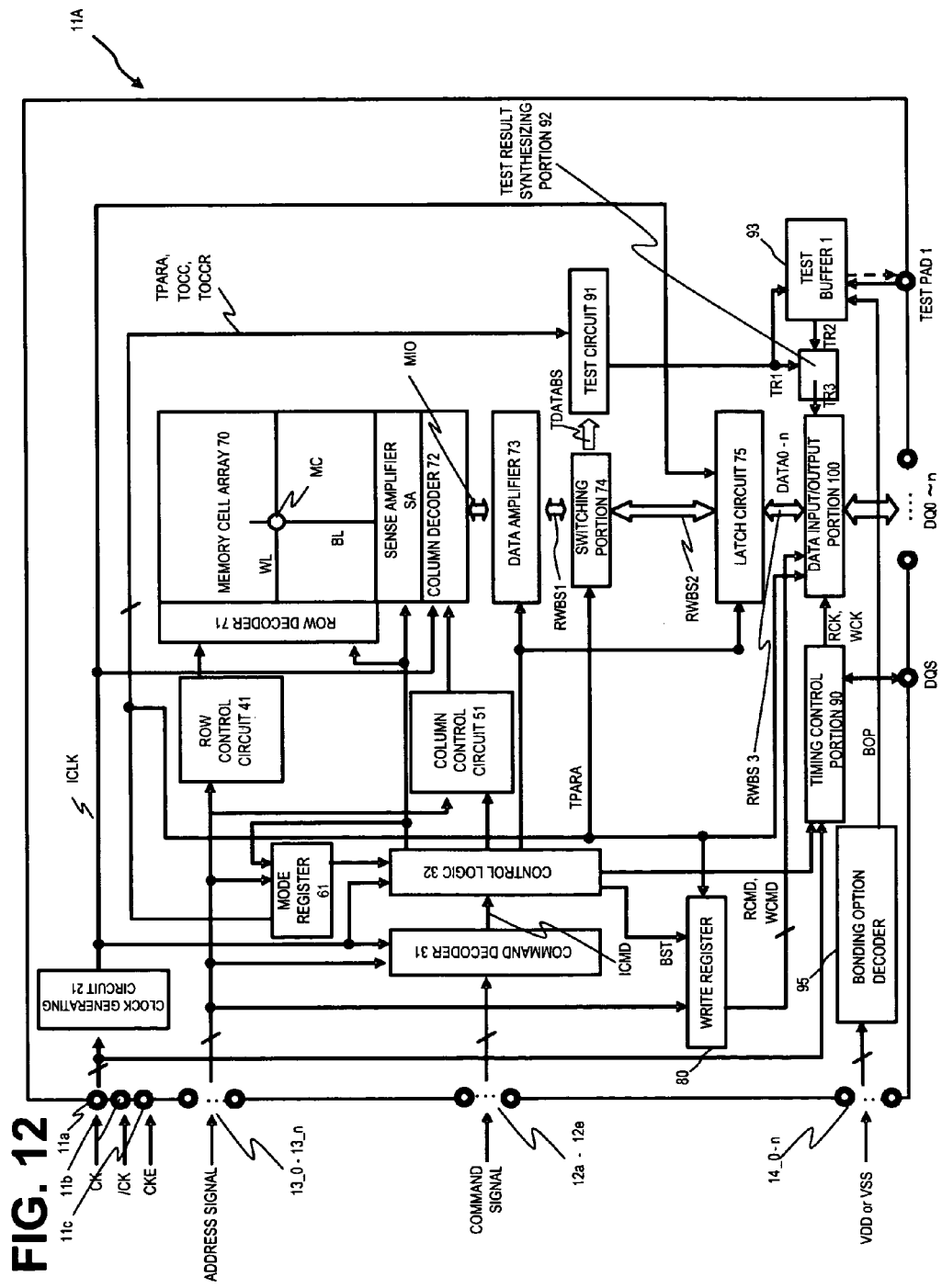
FIG. 12 is a circuit block diagram of the whole semiconductor chip according to an example 2.

FIG. 12 is a circuit block diagram of the whole semiconductor chip according to an example 2. Comparing the semiconductor chip 11A of FIG. 12 with the semiconductor chip 11 of an example 1 of FIG. 5, a test buffer 2 (94), a test pad 2 and a line TDATAW2 connecting a test buffer 2 and a data input/output portion 76 are deleted, a data input/output portion 76 is changed to a data input/output portion 100 and a write register 80 is newly provided.

The write register 80 receives a command (burst stop command BST, for example) for taking a specified test date from a control logic 32, an address signal from an address pad, and a parallel test signal from a mode register 61.

The write register 80 is a circuit for inputting a plurality of test write data TDATA3 from the address pad instead of inputting the test write data via a DQ0 pad at a writing operation of the parallel test.

When writing a write data to read/write lines DATA0 to DATAn commonly from the DQ0 pad, as explained in an example 1, the same test write data is written into all of the memory cells for writing test data at one writing procedure. However, each test write data supplied into each of the read/write lines DATA0 to DATAn can be varied separately when writing a test data using the write register 80 according to an example 2. Thus a writing pattern of the test write data can be changed.

Figure 13:
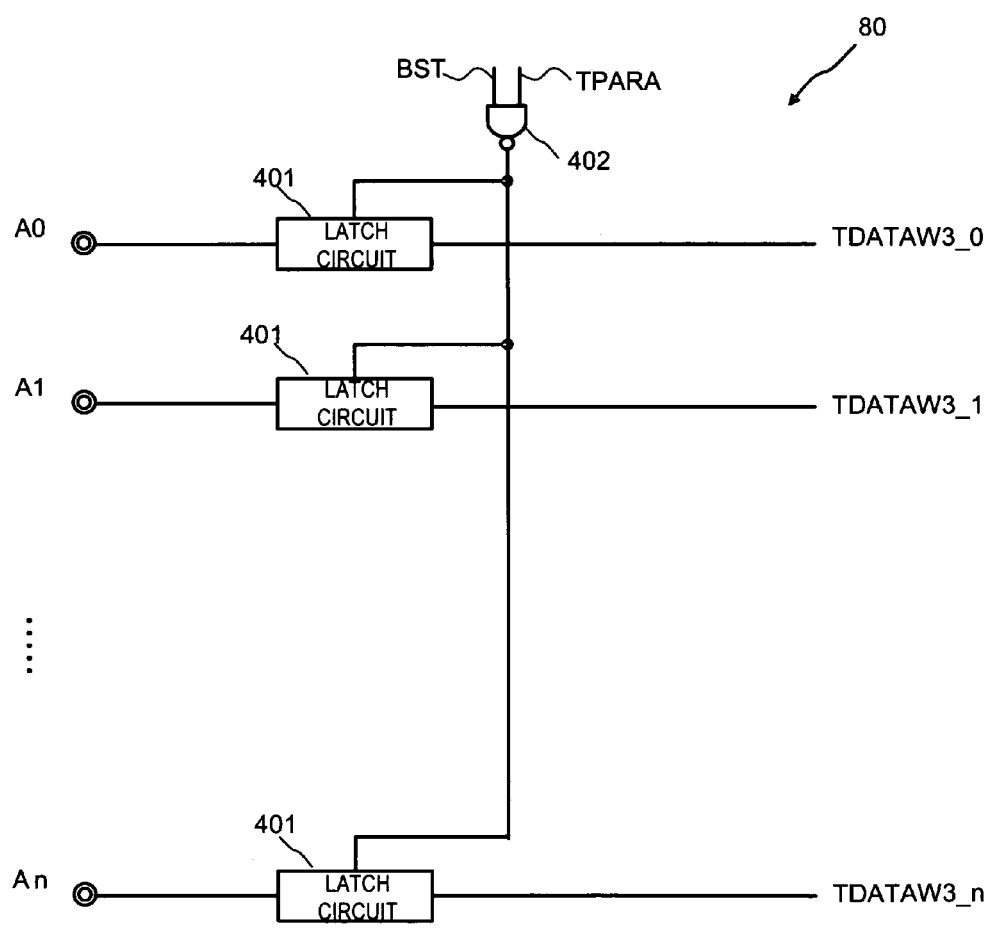
FIG. 13 is a circuit block diagram of a write register according to an example 2.

FIG. 13 is a circuit block diagram of the write register 80 of an example 2. The write register 80 comprises a plurality of latch circuits 401 each of which is connected with a corresponding address pad A0 to An and a NAND circuit 402 to which a command (burst stop command BST, for example) for receiving a specified test data supplied from the control logic 32 and a parallel test signal TPARA are input. An output of the NAND circuit 402 is supplied commonly to a control terminal of each of the latch circuits 401.

The NAND circuit 402 supplies a pulse signal corresponding to a command (burst stop command BST, for example), for taking a specified test data, to the control terminal of each of the latch circuits 401 when a burst stop signal BST corresponding to a command (burst stop command BST, for example), input from outside for taking a specified test data, is input from the control logic while the parallel test signal TPARA is in high level as an active level.

The latch circuit 401 each keeps test write data TD0 to TDn input to corresponding address terminals Am (m is 0 to n) and outputs to the data input/output portion 100 as a test write data TDATAW3_0 to TDATAW3_*n* in accordance with a one-shot-pulse of a command (burst stop command BST, for example) for taking a specified test data supplied from the NAND circuit 402.

Figure 14:
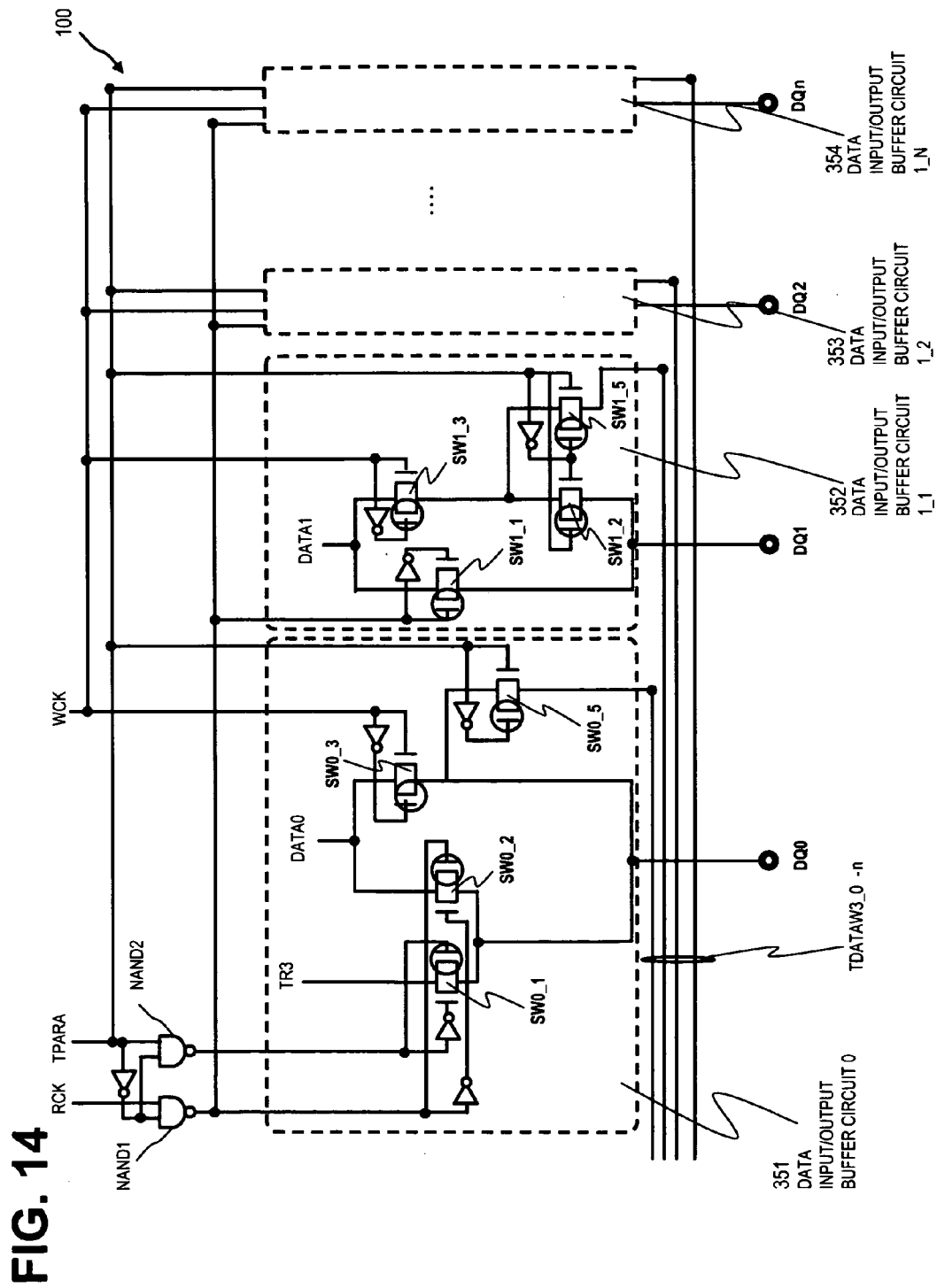
FIG. 14 is a circuit block diagram of a data input/output portion according to an example 2.

FIG. 14 is a circuit block diagram of the data input/output portion 100 of an example 2. In FIG. 14, the same symbol is assigned for a portion of almost the same structure and function as that of the data input/output portion 76 of an example 1 (FIG. 7) and an explanation is omitted. Operations during a normal operation mode are the same as those of the data input/output portion 76 in FIG. 7. The different point is that each of data input/output buffer circuit 351 to 354 of the data input/output portion 100 of an example 2 is connected with the different n-bit test write data TDATAW3_0 to TDATAW3_*n* through switches SW0_5 and SW1_5 to SWn_5, although each of data input/output circuit 251 to 254 of the data input/output portion 76 in FIG. 7 is connected with the common 1-bit test write data TDATAW. The test write data TDATAW3_0 to TDATAW3_*n* are connected with an output of the write register 80 of FIG. 13. Other structures are the same as those of the data input/output portion 76 in FIG. 7.

Figure 16:
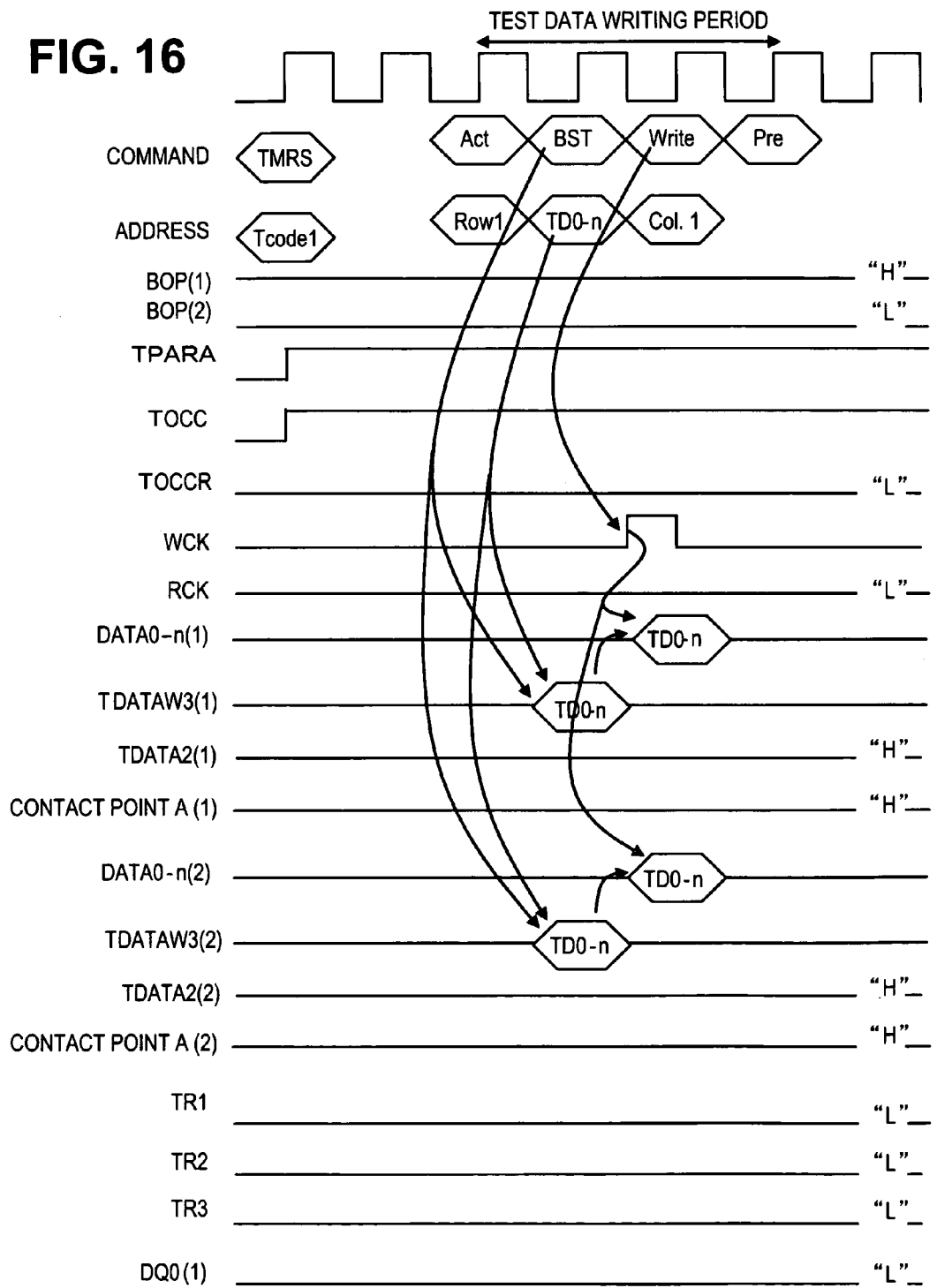
FIG. 16 is an operation wave form diagram during test data writing according to an example 2.

FIG. 16 is an operation wave form diagram during test data writing according to an example 2. At first, the on-chip comparison test mode is set by inputting a test mode register set command TMRS, setting the mode register 61 by a test code Tcode1 input from the address input terminal, and setting the parallel test signal TPARA and the on-chip comparison signal TOCC to high level from low level. The on-chip comparison signal TOCC is kept in low level when setting in a para-test mode. Next, an ACT command is input for designating a bank and a row address and then a BST command is input for taking a write data from an address terminal to the write register 80. After that a write command is input for writing the data taken into the write register 80 into the column address and the row address of the designated bank. It means that data is written without the aid of data input/output pad (DQ pad) in an example 2. Other signal names are the same as those of an example 1 and therefore explanations are omitted. A test reading operation is the same as explained with respect to FIGS. 10 and 11 of an example 1.

Example 3

Figure 17:
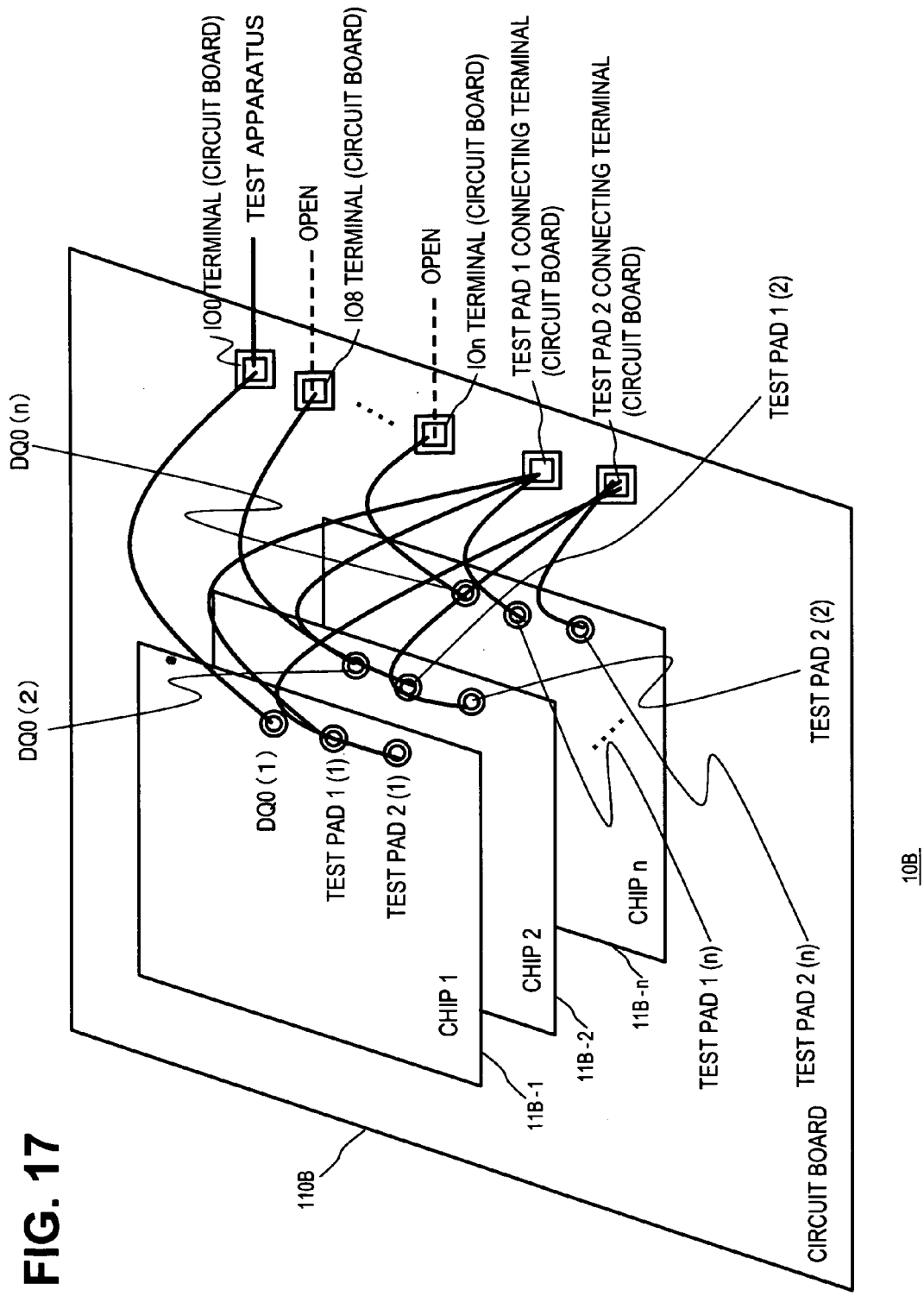
FIG. 17 is a schematic drawing of line connections of a semiconductor device according to an example 3.

FIG. 17 is a schematic drawing of line connections of a semiconductor device according to an example 3. According to an example 3, three or more semiconductor chips 11B-1 to 11B-n are provided on a semiconductor device 10B. A data input/output pad DQ0 of the semiconductor chip 11B-1 only among the n semiconductor chips is connected with a test apparatus and other data input/output pads of other semiconductor chips 11B-2 to 11B-n other than 11B-1 are not connected with the test apparatus. Test pads 1 and test pads 2 of the n semiconductor chips are connected commonly with each other.

Figure 18:
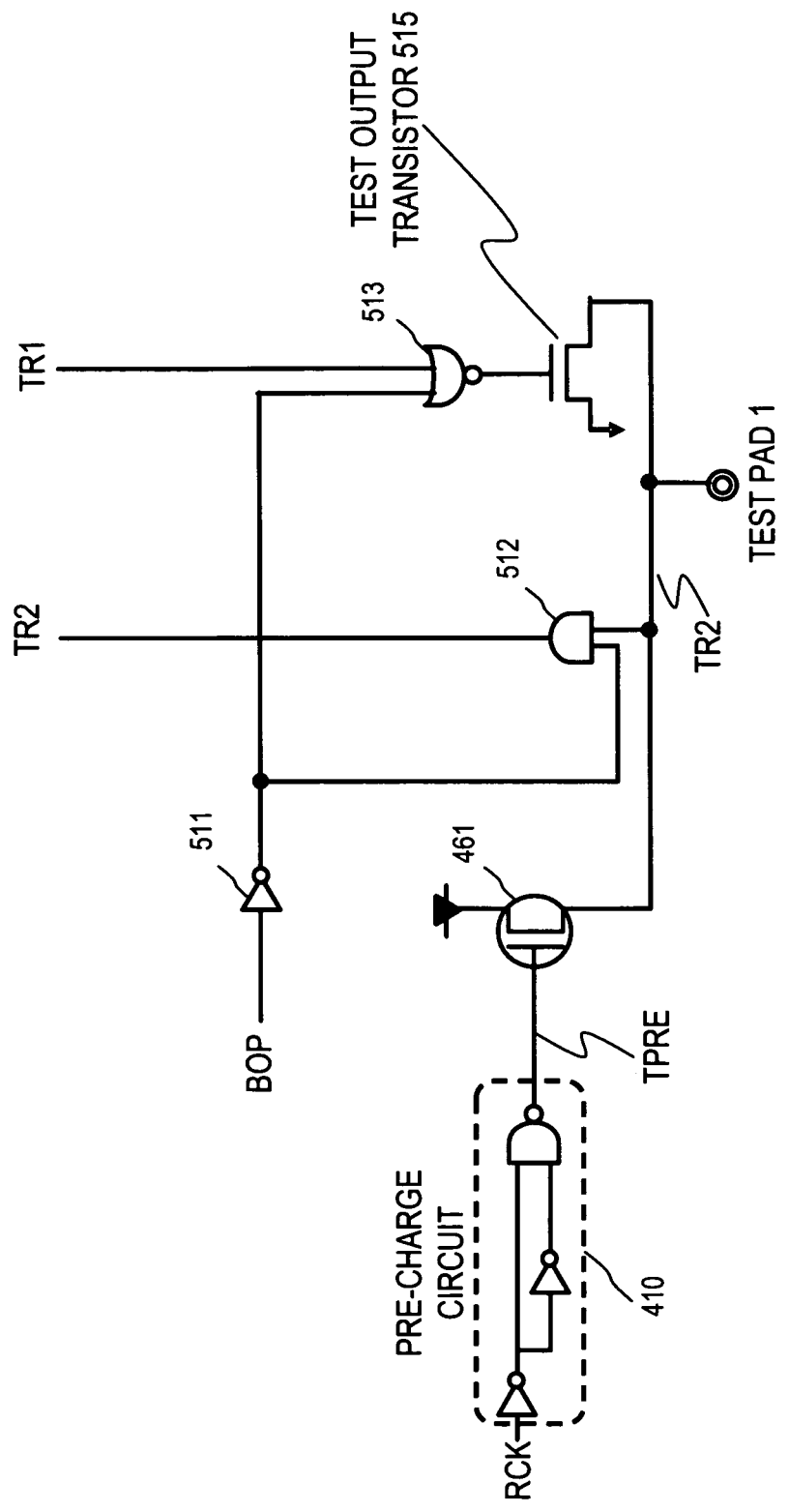
FIG. 18 is a circuit block diagram of a test buffer 1 (test result input/output buffer) according to an example 3.

The semiconductor chip 11B of an example 3 is the same as the semiconductor chip 11 of an example 1 shown in FIG. 5 except that the test buffer 1 (93) is replaced with a test buffer 1 (93A). FIG. 18 is a circuit block diagram of the test buffer 1 (test result input/output buffer 93A) of an example 3.

In FIG. 18, a pre-charge signal generating circuit 410 outputs a pre-charge signal TPRE that keeps low level state for specified period of time to a control terminal of a PMOS transistor 461 in response to a falling down edge of a read timing signal. RCK. The PMOS transistor 461 becomes conductive state for a period of time that the pre-charge signal TPRE is in low level state and pre-charges a line connected with the test pad 1 to a source voltage.

A test output transistor 515 of the test buffer 1 (93A) becomes conductive state for a period of time that the test result signal is low level, that is, the test result means fail and makes a line (including a line outside of the chip) connected with the test pad 1 low level.

An example will be explained in which the test buffer 1 (93A) of the semiconductor chip 11B-1 of FIG. 17 functions as an input buffer and test buffers 1 (93A) of the semiconductor chips 11B-2 to 11B-n function as output buffers. Lines connecting each of the test pads 1 with each of the test buffers 1 of the semiconductor chips 11B-2 to 11B-n, each of the test pads 1, and a test pad 1 connection terminal (board) on the circuit board (FIG. 17) have been pre-charged to the source voltage by the PMOS transistors (FIG. 18) provided on the test buffers 1 of the semiconductor chips before each test result signal TR1 of each of the semiconductor chips 11B-2 to 11B-n is supplied to each of the test buffers 1 (93A) (function as output buffers) of the semiconductor chips. In the case where at least one test result signal TR1 of the semiconductor chips 11B-2 to 11B-n is low level, which means a fail, the lines connecting each of the test pads 1 of the semiconductor chips 11B-2 to 11B-n with each of the test buffers 1, each of the test pads 1, and the test pad 1 connection terminal (board) on the circuit board (FIG. 17) are forced to low level. As a result, the input buffer of the test buffer circuit 1 of the semiconductor chip 11B-1 becomes low level, and a low leveled test result signal TR2 is supplied to a test result synthesizing portion of the semiconductor chip 11B-1. On the other hand, all of the test result signals of the semiconductor chips 11B-2 to 11B-n are high level, which means a pass, a test result signal TR2 supplied to the test result synthesizing portion of the semiconductor chip 11B-1 is high level.

Structures of a plurality of semiconductor chips in a semiconductor device of the above examples can be unified because functions of the test buffer 1 or 2 as an input buffer or output buffer can be selected by the bonding option.

Also because each semiconductor chip of the examples has its own test circuit 91, the test result can be compacted in the semiconductor chip. In addition, by providing the test pad 1 and the test result synthesizing portion 92, parallel read tests of semiconductor chips can be carried out and the test results can be collected to one of the semiconductor chips through each test pad 1 of the semiconductor chips and the total test result of the plurality of semiconductor chips can be output from the semiconductor chip. A structure of the test result synthesizing portion 92 may be a simple one as shown in FIG. 8B as an example because the test circuit 91 provided in each semiconductor chip can compact the test result. Thus an overhead of the semiconductor chip does not become too large even when the test result synthesizing portion is provided in each semiconductor chip. As a result, because structures of semiconductor chips can be unified and tests of the semiconductor chips can be carried out in parallel, a test time for semiconductor devices can be reduced without increasing a number of kinds of semiconductor chips in semiconductor devices.

As explained in the examples, there is a multi-chips packaged semiconductor device in which control signal pads of semiconductor chips are connected commonly with a control signal external connection terminal and data input/output pads are connected respectively with data input/output external connection terminals. When testing such multi-chips packaged semiconductor devices in parallel by connecting with only a part of the data input/output external connection terminals, a write data can be written relatively easily in each semiconductor chip by providing a test mode for inputting the write data from the control signal external connection terminal as explained in an example 2 because the control signal external connection terminal is connected with each semiconductor chip commonly. However, a test result cannot be output from the control signal external connection terminal because the control signal external connection terminal is connected with each semiconductor chip commonly. However, according to the examples explained above, a combined test result of the parallel tests of the semiconductor chips can be output from one semiconductor chip whose data input/output external connection terminal is connected with a test apparatus. Therefore, the test apparatus can execute the test without considering whether the tested semiconductor device is constituted of single semiconductor chip or packaged multiple chips.

It should be noted that other objects, features and aspects of the present invention will become apparent in the entire disclosure and that modifications may be done without departing the gist and scope of the present invention as disclosed herein and claimed as appended herewith. Also it should be noted that any combination or selection of the disclosed and/or claimed elements, matters and/or items may fall under the modification aforementioned.

What is claimed is:

1. A semiconductor device, comprising:
   a plurality of first terminals and a plurality of second terminals;
   a first semiconductor chip that comprises a plurality of first pads connected respectively with the first terminals, a first test circuit and a first memory portion, the first semiconductor chip outputting first data of the first memory portion to the plurality of first terminals through the plurality of first pads during a normal operation, and the first test circuit generating a first test result in response to the first data during a test operation; and
   a second semiconductor chip that comprises a plurality of second pads connected respectively with the plurality of second terminals, a second test circuit, a third test circuit and a second memory portion, the second semiconductor chip outputting a plurality of second data of the second memory portion to the plurality of second data terminals through the plurality of second data pads during the normal operation, and the second test circuit generating a second test result in response to the second data, the third test circuit generating a third test result in response to the second test result and the first test result supplied from the first test circuit of the first semiconductor chip, and the third test result outputting to one of second terminals through a corresponding one of second data pads during the test operation.

2. The semiconductor device according to claim 1, wherein the first semiconductor chip further comprises:
   a plurality of first bonding option pads;
   a first bonding option decoder that outputs a first bonding option signal taking one of a first logic level and a second logic level in response to voltage levels supplied respectively to the plurality of first bonding option pads;
   a first test pad; and
   a first test buffer that serves as a first test output buffer supplies the first test result to the first test pad when the first bonding option signal takes the first logic level, and that serves as a first test input buffer when the bonding option signal takes the second logic level.

3. The semiconductor device according to claim 1, wherein the second semiconductor chip further comprises:
   a plurality of second bonding option pads;
   a second bonding option decoder that outputs a second bonding option signal taking one of a third logic level and a fourth logic level in response to voltage levels supplied respectively to the plurality of second bonding option pads;
a second test pad; and
a second test buffer that serves as a second test input buffer to receive the first test result supplied from the first test circuit of the first semiconductor chip via the second test pad and to supply the first test result to the third test circuit when the second bonding option signal takes the third logic level, and that serves as a second test output buffer when the second bonding option signal takes the fourth logic level.

4. The semiconductor device according to claim 1, wherein the first semiconductor chip is substantially equal in structure to the second semiconductor chip.

5. A semiconductor device, comprising:
a plurality of semiconductor chips each comprising:
    a plurality of first pads and a second pad;
    a memory cell array;
    a first test circuit coupled to the memory cell array and generating a first test result signal in response to first test data of the memory cell array;
    a first input/output buffer coupled to the first test circuit and the second pad, the first input/output buffer supplying the first test result signal to the second pad when the each of the semiconductor chips is in a first test mode, the first input/output buffer generating a second test result signal therein in response to one or ones of third test result signals supplied from the second pad when the each of the semiconductor chips is in second test mode; and
    a second test circuit receiving the first test result signal and the second test result signal, performing a logic operation on logic levels of the first test result signal and the second test result signal to generate a fourth test result signal and supplying the fourth test result signal to first one of the first pads when the each of the semiconductor chips is in the second test mode,
wherein the second pad of one of the semiconductor chips is electrically coupled to the second pad of each of remaining one or ones of the semiconductor chips and the one of the semiconductor chip is in the second test mode and the remaining one or ones of the semiconductor chips are in the first test mode such that the first input/output buffer of the remaining one or ones of the semiconductor chips supplies the first test result signal to the second pad of the one of the semiconductor chips as one of the third test result signals.

6. The semiconductor device as claimed in claim 5, wherein each of the semiconductor devices further comprises:
a fourth pad that receives one of first and second voltage externally supplied, the fourth pad of the one of the semiconductor chips receiving the first voltage and the fourth pad of each of the remaining one or ones of the semiconductor chips receives the second voltage.

7. A device, comprising:
a printed circuit board including a plurality of first terminals and a plurality of second terminals;
a first semiconductor chip comprising:
    a plurality of first pads coupled respectively to the first terminals of the printed circuit board;
    a second pad;
    a first memory cell array;
    a first output unit coupled between the first memory cell array and the first pads; and
    a first circuit coupled between the first memory cell array and the second pad; and
a second semiconductor chip comprising:
    a plurality of third pads coupled respectively to the second terminals of the printed circuit board;
    a fourth pad electrically coupled to the second pad of the first semiconductor chip;
    a second memory cell array;
    a second output unit coupled between the second memory cell array and the third pads; and
    a second circuit coupled to the fourth pad at an input node thereof and coupled to the second output unit at an output node thereof.

8. The device as claimed in claim 7, further comprising a plurality of first bonding wires each coupled between an associated one of the first terminals and an associated one of the first pads and a plurality of second bonding wires each coupled between an associated one of the second terminals and an associated one of the third pads.

9. The device as claimed in claim 7, wherein the second semiconductor chip further includes a third circuit coupled to the memory cell array, and the second circuit is coupled to the third circuit at an input node thereof.

10. The device as claimed in claim 7, wherein the first circuit includes a plurality of input nodes coupled to the first memory cell array, a output node coupled to the second pad and a logic circuit coupled between the input nodes of the first circuit and the output node of the first circuit, and
    wherein the logic circuit is configured to perform a logic operation on logic levels of the input nodes of the first circuit to generate a first signal and outputs the first signal to the output node of the first circuit.

11. The device as claimed in claim 7, wherein the printed circuit board further includes a third terminal coupled in common to the second pad and the fourth pad.

12. The device as claimed in claim 11, further comprising a plurality of first bonding wires each coupled between an associated one of the first terminals and an associated one of the first pads, a plurality of second bonding wires each coupled between an associated one of the second terminals and an associated one of the third pads, a third bonding wire coupled between the second pad and the third terminal, and a fourth bonding wire coupled between the fourth pad and the third terminal.

13. The device as claimed in claim 7, wherein the printed circuit board further includes a plurality of third terminals,
    wherein the first semiconductor chip further includes:
        a plurality of fifth pads coupled respectively to the third terminals;
        a plurality of first selection lines disposed in the first memory cell array;
        a first decoder circuit coupled between the fifth pads and the first memory cell array; and
        a first register coupled between the fifth pads and the first data output unit, and
    wherein the second semiconductor chip further includes:
        a plurality of sixth pads coupled respectively to the third terminals;
        a plurality of second selection lines disposed in the second memory cell array;
        a second decoder circuit coupled between the sixth pads and the second memory cell array; and
        a second register coupled between the sixth pads and the second data output unit.

14. The device as claimed in claim 13, further comprising a plurality of first bonding wires each coupled between an associated one of the first terminals and an associated one of the first pads and a plurality of second bonding wires each coupled between an associated one of the second terminals and an associated one of the third pads.

15. The device as claimed in claim 13, wherein the printed circuit board further includes a fourth terminal coupled in common to the second pad and the fourth pad.

16. The device as claimed in claim 15, further comprising a plurality of first bonding wires each coupled between an associated one of the first terminals and an associated one of the first pads, a plurality of second bonding wires being each coupled between an associated one of the second terminals and an associated one of the third pads, a third bonding wire being coupled between the second pad and the fourth terminal, and a fourth bonding wire being coupled between the fourth pad and the fourth terminal.

* * * * *